(12) United States Patent
Ichikawa et al.

(10) Patent No.: US 12,100,821 B2
(45) Date of Patent: Sep. 24, 2024

(54) BUS BAR MODULE

(71) Applicant: YAZAKI CORPORATION, Tokyo (JP)

(72) Inventors: Yoshiaki Ichikawa, Makinohara (JP); Kimitoshi Makino, Makinohara (JP); Makoto Kobayashi, Makinohara (JP); Tomoji Yasuda, Makinohara (JP); Masahiro Takamatsu, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 17/973,313

(22) Filed: Oct. 25, 2022

(65) Prior Publication Data
US 2023/0039725 A1   Feb. 9, 2023

Related U.S. Application Data

(63) Continuation of application No. 16/506,480, filed on Jul. 9, 2019, now Pat. No. 11,515,604.

(30) Foreign Application Priority Data

Jul. 10, 2018 (JP) ................................. 2018-130912
Jul. 31, 2018 (JP) ................................. 2018-144238

(51) Int. Cl.
*H01M 10/48* (2006.01)
*H01M 10/42* (2006.01)
(Continued)

(52) U.S. Cl.
CPC ....... *H01M 10/482* (2013.01); *H01M 10/425* (2013.01); *H01M 50/20* (2021.01);
(Continued)

(58) Field of Classification Search
CPC ........................... H01M 50/20; H01M 50/502
See application file for complete search history.

(56) References Cited

U.S. PATENT DOCUMENTS

2013/0164595 A1* 6/2013 Takase .............. H01M 10/6554
429/120
2013/0309553 A1   11/2013 Kinoshita et al.
(Continued)

FOREIGN PATENT DOCUMENTS

| CN | 103339761 A | 10/2013 |
|---|---|---|
| JP | 2012-169256 A | 9/2012 |

(Continued)

*Primary Examiner* — Barbara L Gilliam
*Assistant Examiner* — Jordan E Berresford
(74) *Attorney, Agent, or Firm* — KENEALY VAIDYA LLP

(57) ABSTRACT

A bus bar module includes a circuit body, a bus bar, a holder, and a cover configured to be assembled to the holder to protect the circuit body and the holder. The circuit body includes a belt-like main line that extends in a first direction, a belt-like branch line that extends from the main line so as to branch from the main line, and a connection portion provided in a position closer to a distal end of the branch line than a folded portion the branch line. The cover is structured so as to be stretchable and shrinkable in the first direction in accordance with a stretching and a shrinking of the holder in the first direction.

6 Claims, 24 Drawing Sheets

(51) Int. Cl.
  *H01M 50/20*   (2021.01)
  *H01M 50/502*  (2021.01)
  *H01M 50/507*  (2021.01)
  *H05K 1/02*    (2006.01)
  *H05K 1/11*    (2006.01)
  *H01M 50/209*  (2021.01)

(52) U.S. Cl.
  CPC ....... *H01M 50/502* (2021.01); *H01M 50/507* (2021.01); *H05K 1/028* (2013.01); *H05K 1/118* (2013.01); *H01M 50/209* (2021.01)

(56) References Cited

U.S. PATENT DOCUMENTS

2014/0349165 A1  11/2014  Ogasawara et al.
2016/0254515 A1   9/2016  Shimoda et al.

FOREIGN PATENT DOCUMENTS

| JP | 2013105571 A | * | 5/2013 | |
| JP | 2014-220128 A | | 11/2014 | |
| JP | 2014-229594 A | | 12/2014 | |
| JP | 2015-230778 A | | 12/2015 | |
| WO | WO-2012160981 A1 | * | 11/2012 | .......... H01M 2/1077 |

\* cited by examiner

FIG.14A
FIG.14B
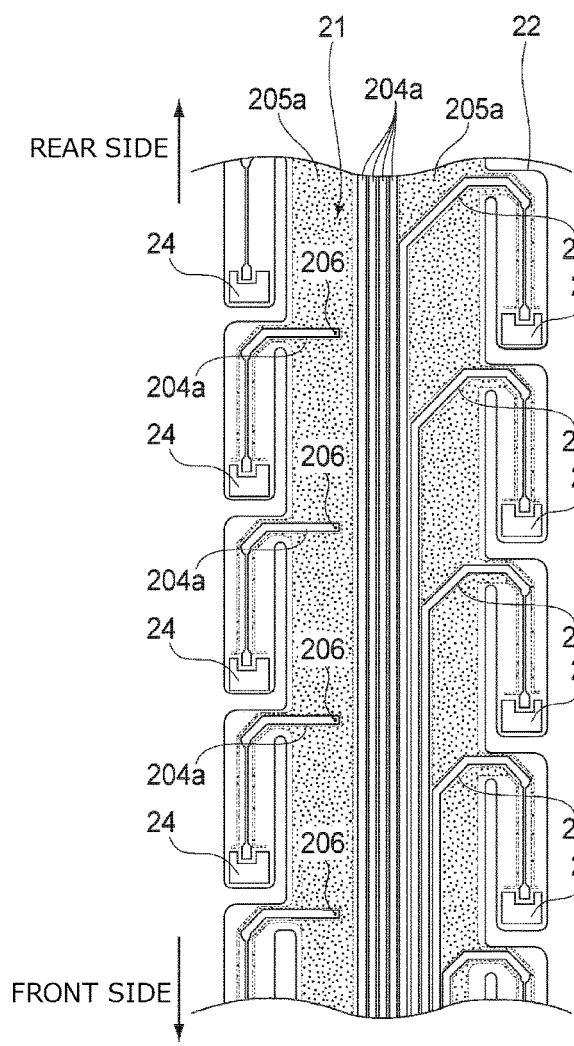
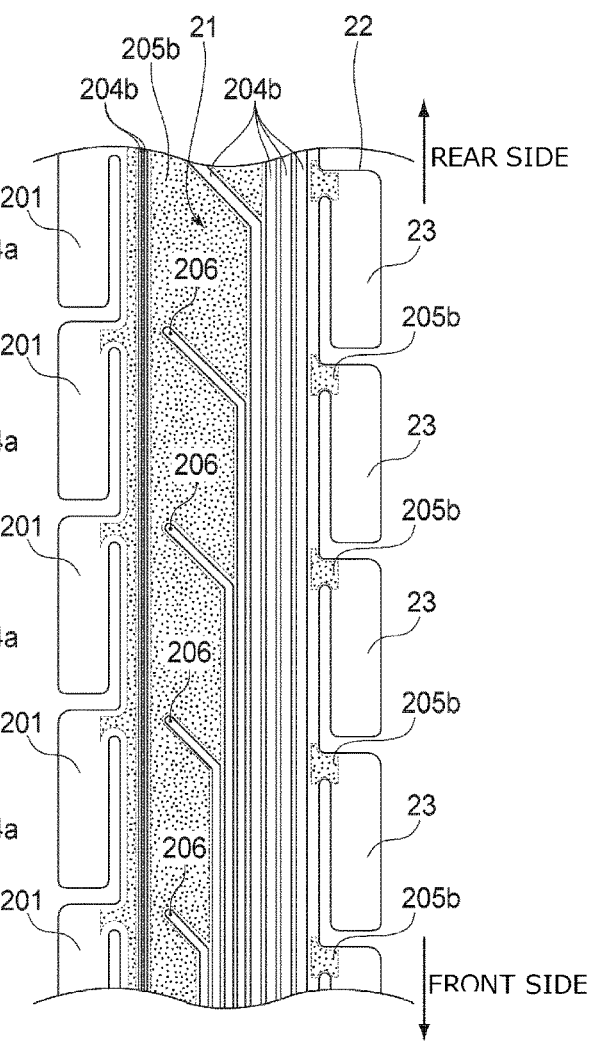

BUS BAR MODULE

CROSS REFERENCE TO RELATED APPLICATIONS

This application is a Continuation of and claims priority under 35 U.S.C. § 102 to U.S. application Ser. No. 16/506,480, filed on Jul. 9, 2019 and also claims priority under 35 U.S.C. § 119 to Japanese Patent Application (No. 2018-130912) filed on Jul. 10, 2018 and Japanese Patent Application (No. 2018-144238) filed on Jul. 31, 2018, the contents of each of which are incorporated herein by reference.

BACKGROUND OF THE INVENTION

1. Field of the Invention

The present invention relates to a bus bar module.

2. Description of the Related Art

Conventionally, a bus bar module has been used in such a manner as to be assembled to a battery assembly (a battery module where a plurality of battery cells are disposed so as to be assembled) as a driving power source mounted on, for example, an electric car and a hybrid car (for example, see JP-A-2014-220128).

A bus bar module described in JP-A-2014-220128 is provided with: a plurality of bus bars connecting between the positive electrodes and the negative electrodes of the battery cells assembled so as to adjoin each other; and a voltage detection line connected to the bus bars in order to monitor the battery cells. This voltage detection line is formed by bundling a plurality of electric wires of a typical structure where a core wire is covered with an insulating film.

Typically, the battery cells constituting a battery assembly stretch and shrink in the assembled direction due to the operation heat accompanying charge and discharge, the temperature of the external environment and the like. As a consequence, the battery assembly (battery module) also becomes deformed so as to stretch and shrink in the assembled direction of the battery cells. Moreover, typically, the size of the battery assembly in the assembled direction can differ among the manufactured battery assemblies (manufacturing variations can occur) due to the assembly tolerances when a plurality of battery cells are disposed so as to be assembled. Accordingly, in order to conform to the deformation of the battery assembly and the manufacturing variations, the bus bar modules is typically designed so that the length of the voltage detection line has a certain extent of margin.

However, in the above-described conventional bus bar module, when the number of laminations of the battery cells is increased, for example, for the purpose of increasing the capacity of the battery assembly, the number of electric wires constituting the voltage detection line also increases. As a consequence, if the voltage detection line is formed by bundling the multiplicity of electric wires, the overall stiffness of the voltage detection line (accordingly, the stiffness of the bus bar module) increases, so that it can be difficult to improve the workability (assemblability) at the time of assembly of the bus bar module to the battery assembly. For the same reason, it can be difficult for the bus bar module to stretch and shrink so as to be sufficiently conform to the deformation and the manufacturing variations of the battery assembly.

SUMMARY OF THE INVENTION

The present invention is made in view of the above-described circumstances, and an object thereof is to provide a bus bar module excellent in the assemblability to the battery assembly and the conformability to the deformation and the manufacturing variations of the battery assembly.

To attain the above-mentioned object, a bus bar module according to the present invention is characterized by the following [1] to [3]:

[1] A bus bar module configured to be attached to a battery assembly having a plurality of single cells which are assembled to each other along a first direction, the bus bar module including:
  a circuit body configured by a flexible board on which a wiring pattern is provided;
  a bus bar configured to be connected to an electrode of each of the single cells;
  a holder configured to hold the bus bar and being stretchable and shrinkable in the first direction; and
  a cover configured to be assembled to the holder to protect the circuit body and the holder,
  in which the circuit body includes:
    a belt-like main line that extends in the first direction;
    a belt-like branch line that extends from the main line so as to branch from the main line, a part of the branch line extending in the first direction and including a folded portion having a shape folded back around an axis intersecting with the first direction; and
    a connection portion provided in a position closer to a distal end of the branch line than the folded portion and configured to be connected to the bus bar; and
  in which the cover is structured so as to be stretchable and shrinkable in the first direction in accordance with a stretching and a shrinking of the holder in the first direction.

[2] In the bus bar module according to the above [1], the cover has a plurality of portions arranged in the first direction and the plurality of portions are coupled to each other so as to be movable relatively to each other.

[3] In the bus bar module according to the above [2], a movable range of each of the plurality of portions is limited, and each of the plurality of portions is structured so as to prevent an inside and outside of the cover from communicating with each other even when each of the plurality of portions is arranged in the movable range.

According to the bus bar module of the structure of the above [1], the circuit body formed of a flexible board is formed of the belt-like main line and the belt-like branch line branching from the main line. At least part of the branch line includes the folded portion having the shape folded back around the axis intersecting with the assembled direction of the single cells. For this reason, when the battery assembly stretches or shrinks in the assembled direction due to thermal deformation of the single cells, the folded portion of the branch line of the circuit body bends and stretches, whereby the bus bars are movable in the assembled direction of the single cells. Likewise, by the folded portion of the branch line of the circuit body bending and stretching, variations in the size of the battery assembly in the assembled direction due to the assembly tolerances of the single cells can be absorbed. In other words, the bus bar module of the present structure is capable of easily handling the stretch and shrinkage and the manufacturing variations of the battery assembly substantially by the deformation of only the branch line without the need for any deformation of the main line of the circuit body. Moreover, even when a multiplicity of circuit structures are contained, the flexible board is typically easy to become deformed flexibly with a far smaller force than normal electric wires used for the above-described conventional bus bar module. For this reason, the assemblability to the battery assembly is significantly improved.

Further, since the cover also stretches and shrinks in the lamination direction as the holder stretches and shrinks in the lamination direction, the circuit body and the bus bar can be protected from the outside while the assemblability to the battery assembly and the conformability to the manufacturing variations are improved.

According to the bus bar module of the structure of the above [2], by coupling a plurality of parts so as to be relatively movable in the lamination direction, a cover stretchable and shrinkable in the lamination direction in response to the stretch and shrink of the bus bar in the lamination direction can be easily realized.

According to the bus bar module of the structure of the above [3], even if the plurality of parts constituting the cover each move as the bus bar stretches and shrinks, the inside and outside of the covert do not communication with each other. Consequently, even if the cover stretches and shrinks, the condition where the circuit body and the bus bar are protected from the outside can be maintained.

According to the present invention, a bus bar module can be provided that is excellent in the assemblability to the battery assembly and the conformability to the deformation and the manufacturing variations of the battery assembly.

The present invention has been briefly described above. Further, details of the present invention will be further clarified by reading through the mode for carrying out the invention (hereinafter, referred to as "embodiment") described below with reference to the attached drawings.

BRIEF DESCRIPTION OF DRAWINGS

FIG. 8A shows a case where the folded portion is Z-shaped as a whole, FIG. 8B shows a case where the folded portion is C-shaped as a whole, and FIG. 8C shows a case where the folded portion is O-shaped as a whole.

FIG. 14A is a cross-sectional view corresponding to an upper side metal layer on a part of the circuit body, and FIG. 14B is a cross-sectional view corresponding to a lower side metal layer on part of the circuit body.

DETAILED DESCRIPTION OF THE EXEMPLARY EMBODIMENTS

Embodiment

Figure 1:
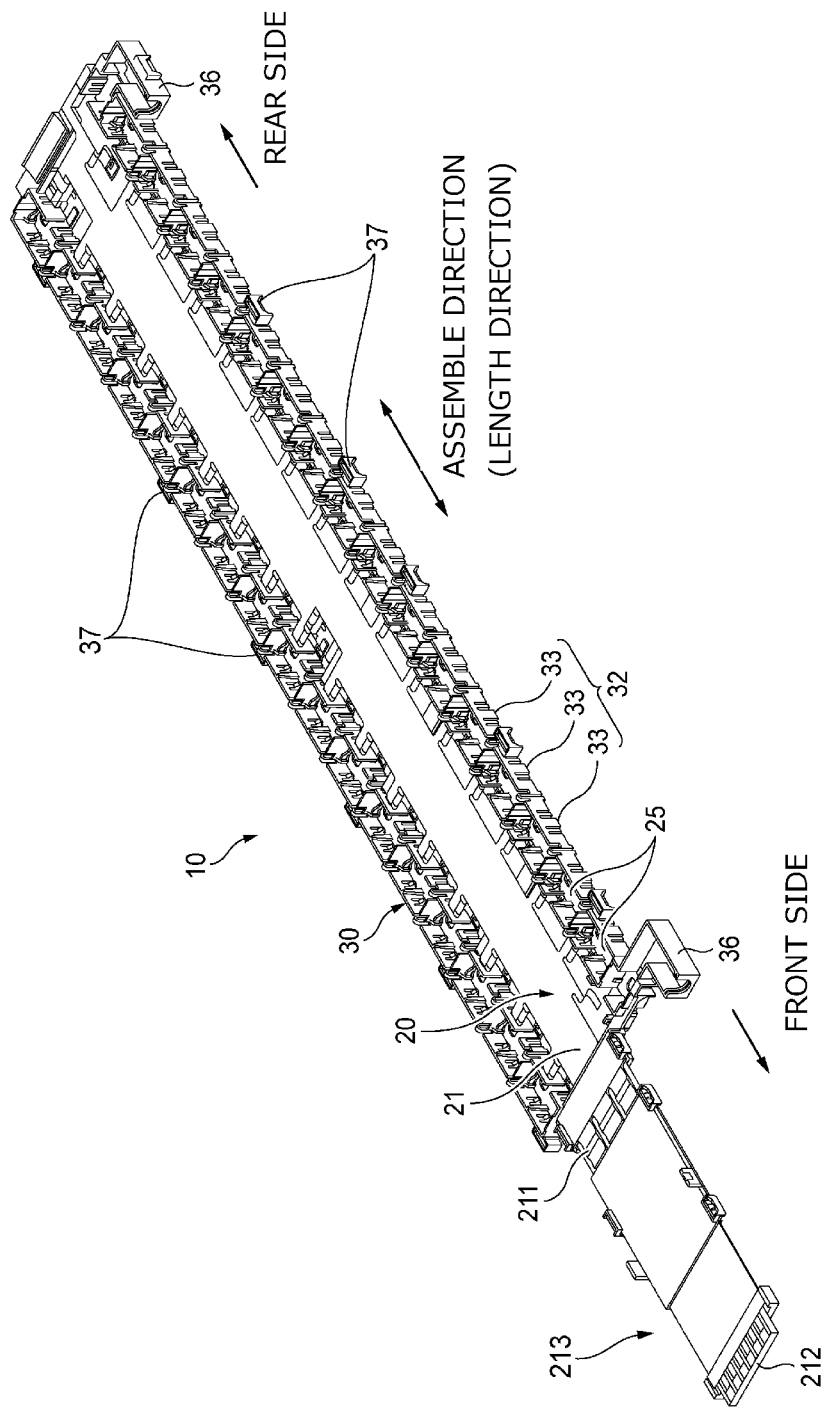
FIG. 1 is an overall perspective view of a bus bar module according to the present embodiment.

Hereinafter, referring to the drawings, a bus bar module 10 according to an embodiment of the present invention will be described. The bus bar module 10 according to the present embodiment is used in such a manner as to be assembled to a battery assembly (a battery module where a plurality of single cells are disposed so as to be assembled) as a driving power source mounted on, for example, an electric car and a hybrid car.

(Structure of the Battery Assembly)

Figure 2:
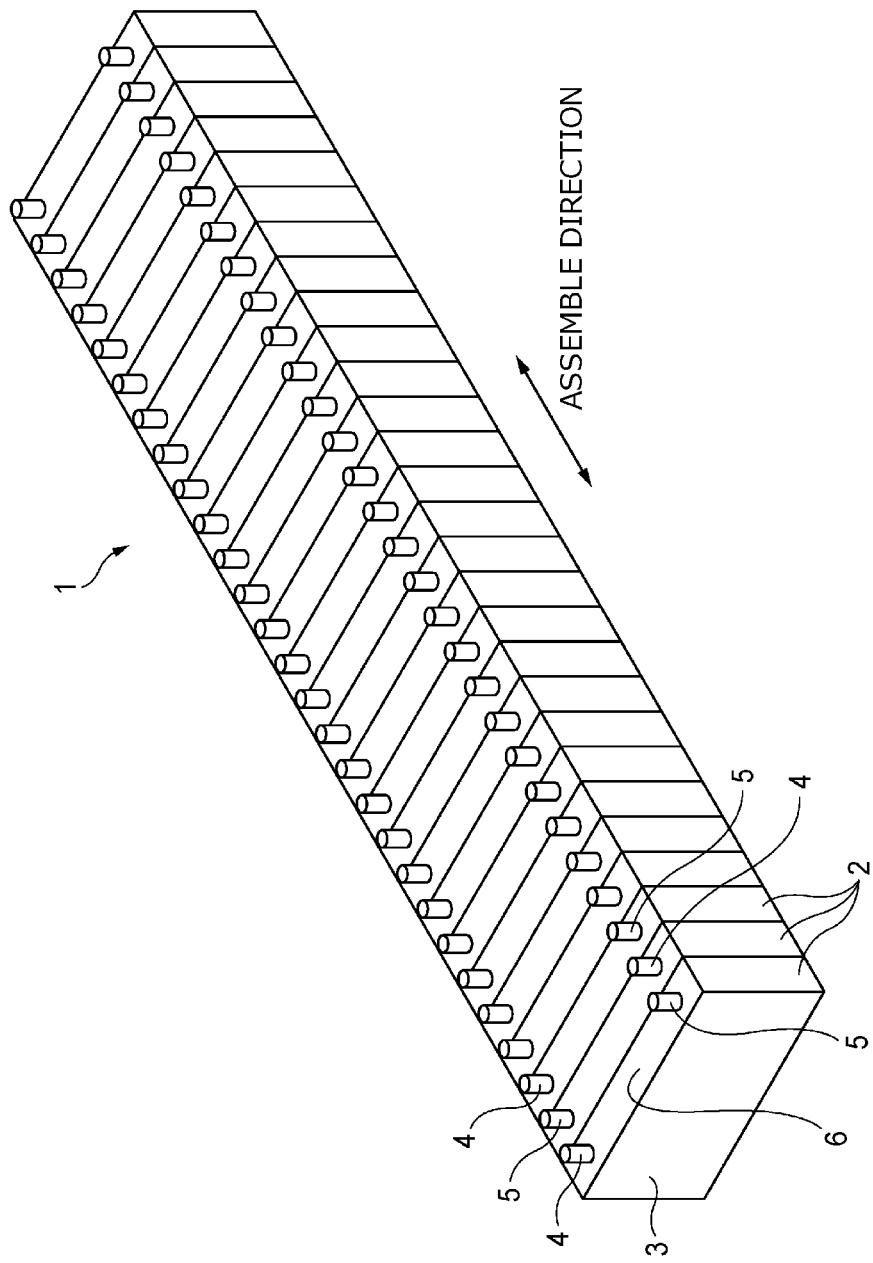
FIG. 2 is a perspective view of a battery assembly to which the bus bar module to which the present invention is applied is assembled.

First, a battery assembly 1 to which the bus bar module 10 of the present embodiment is attached will be described. As shown in FIG. 2, the battery assembly 1 is formed by linearly connecting a plurality of single cells 2. The single cells 2 each have a positive electrode 4 and a negative electrode 5 provided so as to project on the top portion of a battery body (body) 3 formed in a rectangular shape. The positive electrode 4 and the negative electrode 5 are disposed away from each other on an electrode surface 6 of the battery body 3, and are each provided so as to substantially vertically project upward from the electrode surface 6 in a cylindrical shape.

In the battery assembly 1, the single cells 2 are arranged so as to be assembled in a predetermined direction (assembled direction) in such a manner that the positive electrodes 4 and the negative electrodes 5 of the adjoining single cells 2 alternate with each other. In this battery assembly 1, for example, the positive electrode 4 of one of the single cells 2 corresponding to both ends of the series-connected single cells 2 is the total positive electrode, whereas the negative electrode 5 of the other of the single cells 2 is the total negative electrode.

(General Structure of the Bus Bar Module)

Next, the bus bar module of the present embodiment will be described. As shown in FIG. 1, the bus bar module 10 has: a circuit body 20 formed of a flexible board (FPC) and to which bus bars 25 (see FIG. 3) connected to the positive electrodes 4 and the negative electrodes 5 of the single cells 2 are attached; and a holder (wire routing member) 30 for accommodating and holding the circuit body 20 and for the attachment to the battery assembly 1.

Figure 3:
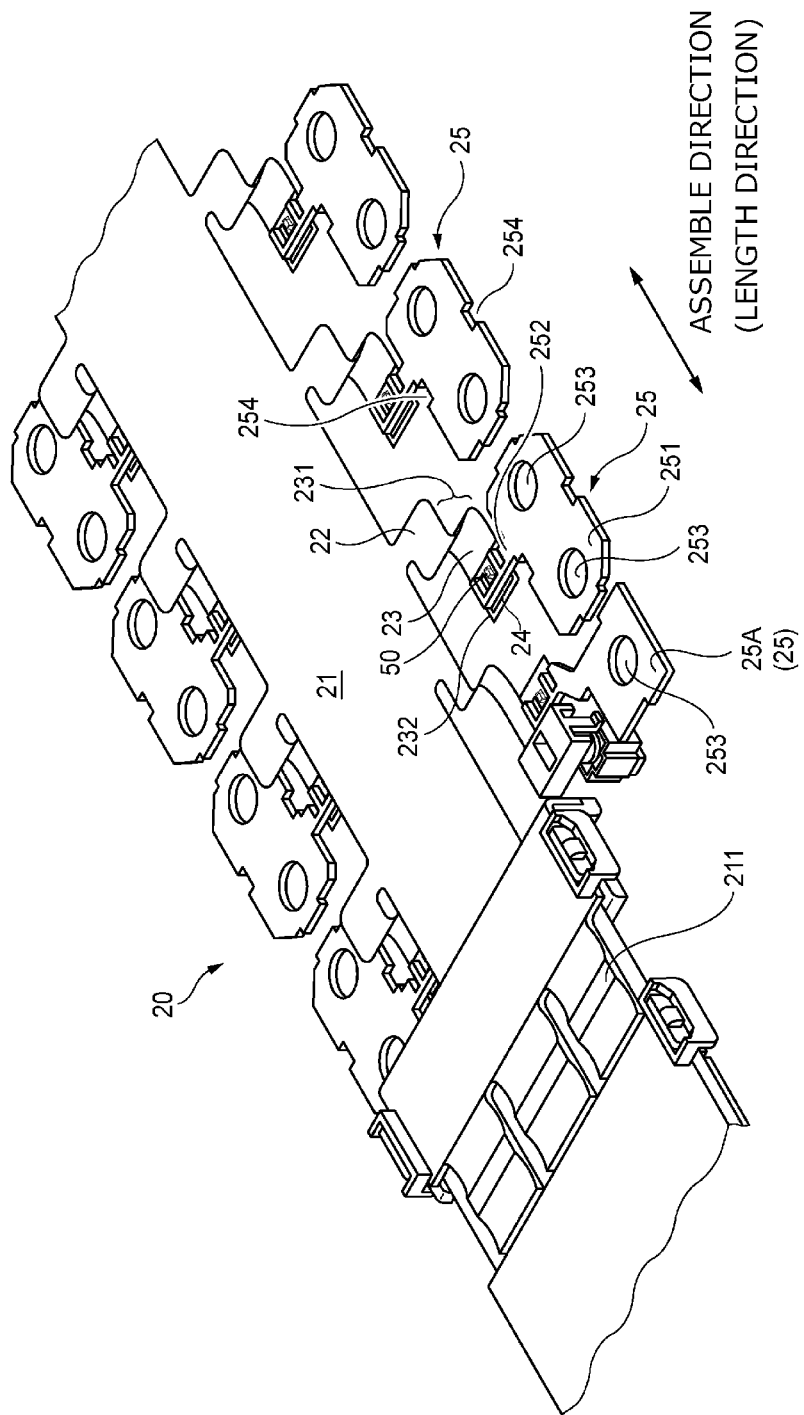
FIG. 3 is a perspective view where an end portion of a circuit body is enlarged.

As shown in FIGS. 1 and 3, the circuit body 20 has a belt-like main line 21 disposed in the assembled direction on the single cells 2 and where a plurality of wiring patterns (details will be described later) are provided. To an end portion of the main line 21, a connector 212 is attached through a voltage detection line 211 pulled out from the main line 21. The connector 212 is connectable to a later-described voltage detector 60 (see FIG. 22).

On the side portions of the main line 21 in the length direction (in the present example, substantially coinciding with the "assembled direction" of the battery assembly 1), belt-like first branch portions 22 extending in a direction intersecting with the length direction and thickness direction of the main line 21 (outside of the main line 21 in the width direction) are provided, and at the leading end of each first branch portion 22, a belt-like second branch portion 23 extending in a direction parallel to the assembled direction of the battery bodies 3 is provided. The main line 21, the first branch portions 22 and the second branch portions 23 are formed of an FPC. Therefore, the main line 21, the first branch portions 22 and the second branch portions 23 are flexibly deformable particularly in a direction orthogonal to the surface of each.

Figure 4:
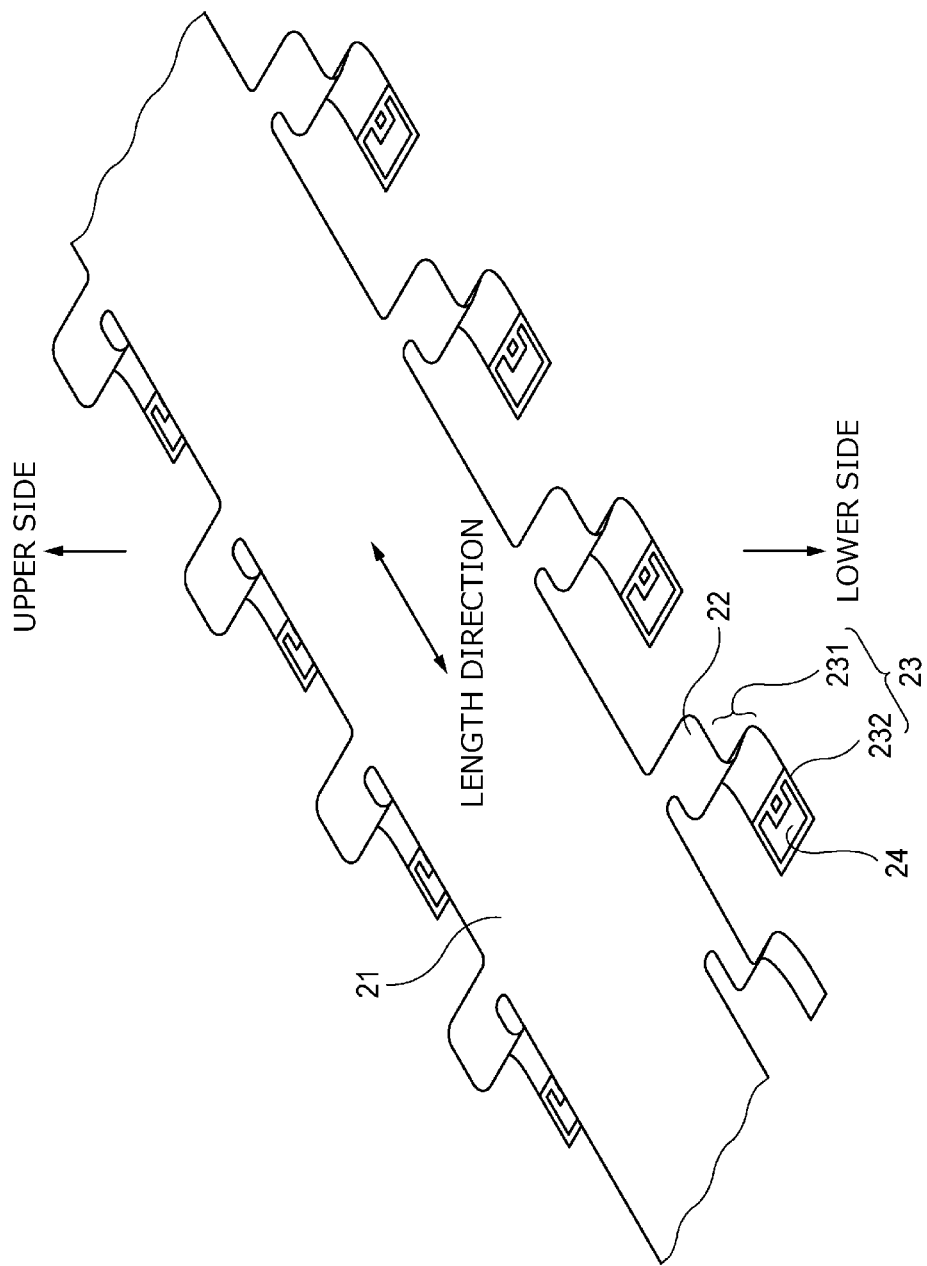
FIG. 4 is a perspective view showing the structure of a main line, first branch portions and second branch portions constituting the circuit body.
Figure 5A:
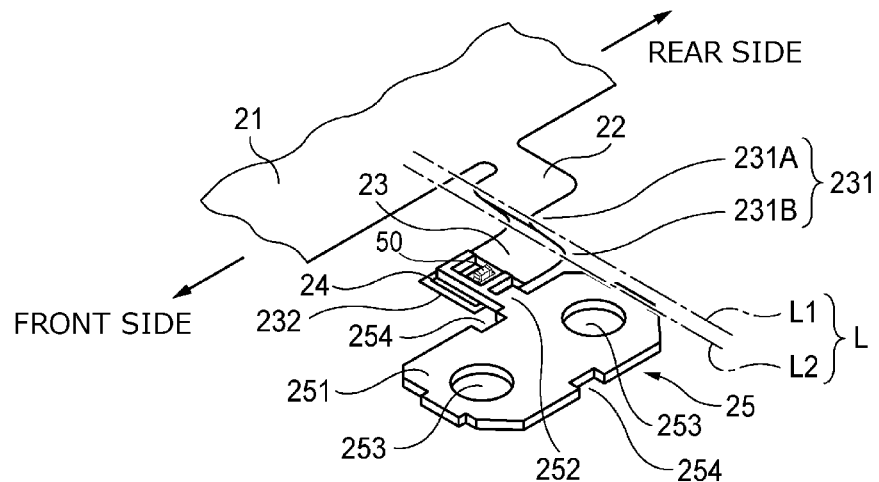
FIG. 5A is a perspective view showing a condition where the second branch portion is bent in an S shape as a whole.

As shown in FIGS. 4 and 5A, the second branch portions 23 each have a folded portion 231 folded back around axes L1 and L2 (in other words, around axes extending in the width direction of the second branch portion 23) intersecting with the assembled direction of the battery assembly 1 (in the present example, substantially coinciding with the extension direction of the second branch portion 23). In the present example, the second branch portions 23 are each bent in an S shape (including an inverted S shape) as a whole by a first folded portion 231A folded back with respect to the axis L1 and a second folded portion 231B folded back with respect to the axis L2. For this reason, the second branch portion 23 is movable in the length direction of the main line 21 (the assembled direction of the battery assembly 1) and stretchable and shrinkable also in the vertical direction.

The first branch portion 22 is provided so as to be flush with the main line 21 outside the main line 21, and the second branch portion 23 is connected to the first branch portion 22. For this reason, the second branch portion 23 is provided outside the main line 21 in the width direction, and is provided so as to be S-shaped downward under the condition where the relative positions of the battery assembly 1 and the circuit body 20 do not change (see FIG. 5A). For this reason, the bus bar 25 is situated below the plane of the main line 21 outside the main line 21 in the width direction.

Moreover, on the end portion of the second branch portion 23 opposite to the first branch portion 22, a leading end portion 232 having a surface substantially parallel to the main line 21 is provided, and to the upper surface of the leading end portion 232, a connection portion 24 is attached. The lower surface of the connection portion 24 is provided parallel to the lower surface of the main line 21 in a different height position, and the lower surfaces are away from each other. The upper surface of the connection portion 24 is connected to the bus bar 25 connecting the positive electrode 4 and the negative electrode 5 of the adjoining single cells 2 in the battery assembly 1. Thereby, the second branch portion 23 is connected to the electrodes of each single cell 2 through the connection portion 24 and the bus bar 25, so that the voltage detection line 211 is connected to the electrodes.

As shown in FIGS. 3 and 5A to 5C, the bus bar 25 has: a bus bar body 251 which is a plate-like member formed of a conductor (for example, made of copper) and is rectangular as a whole; and a connection piece 252 projecting from the bus bar body 251 toward the main line 21. The bus bar body 251 is provided with two electrode holes 253 through which the positive electrode 4 and the negative electrode 5 of the adjoining single cells 2 are passed. At the end portion on the side of the main line 21 and the end portion on the opposite side on the bus bar body 251, positioning concave portions 254 are provided so as to correspond to intervals between the two electrode holes 253. Moreover, to the lower surface of the connection piece 252 of the bus bar body 251, the connection portion 24 of the second branch portion 23 is connected. A concrete form of the connection between the connection piece 252 of the bus bar 25 and the connection portion 24 of the second branch portion 23 will be described later.

A bus bar 25A provided on each end of the main line 21 in the length direction is connected to the total positive electrode or the total negative electrode, and is provided with one electrode hole 253 through which the total positive electrode or the total negative electrode is passed. To the bus bar 25A, a power cable (not shown) that derives power from the battery assembly 1 is connected. The internal structure of the main line 21, the first branch portions 22 and the second branch portions 23 constituting the circuit body 20 will be described later.

(Structure of the Holder)

Figure 6:
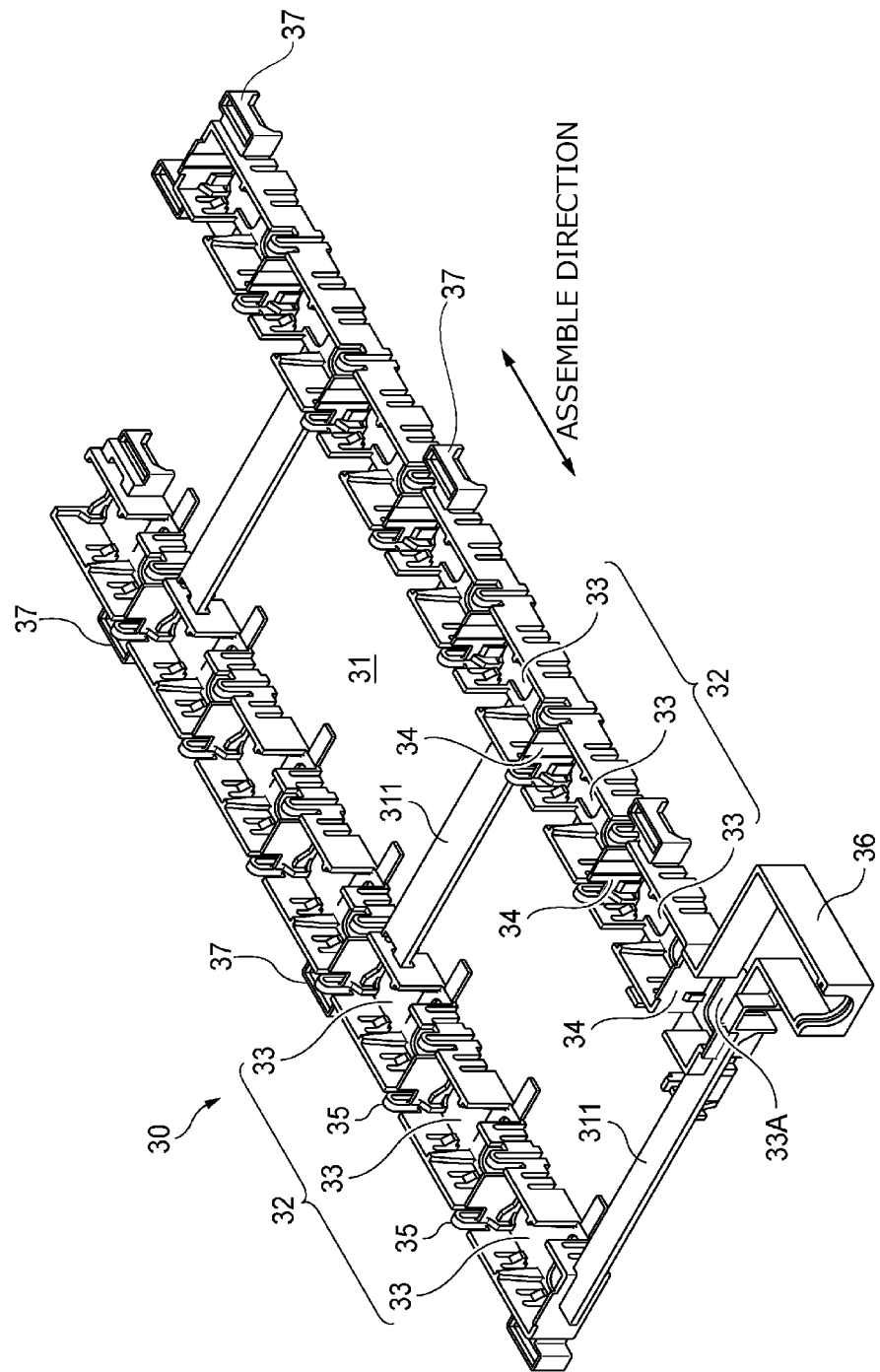
FIG. 6 is a perspective view showing a part of the holder.

As shown in FIG. 6, the holder 30 is formed of, for example, resin, and has, in a central portion in the width direction, a main line accommodating portion 31 extending in the assembled direction of the single cells 2 and accommodating and holding the main line 21. The main line accommodating portion 31 is provided with main line support members 311 at predetermined intervals in the length direction of the main line 21 that it accommodates, and the main line 21 is routed on the main line support members 311. When the main line 21, the first branch portions 22 and the second branch portions 23 have a strength of a degree capable of maintaining a condition where the circuit body 20 of the present example is self-standing without the support by the main line support members 311, it is unnecessary to provide the main line support members 311. However, even in this case, the main line support members 311 may be provided in order to deliver an auxiliary support function when the circuit body 20 cannot maintain the self-standing condition for some reason. As described above, the circuit body 20 may be configured so as to maintain the above-mentioned condition by using the main line support members 311 or may be configured so as to be self-standing without the use of the main line support members 311.

On each outer side of the main line accommodating portion 31 in the width direction, a bus bar accommodating portion 32 accommodating the bus bar 25 is provided. In the bus bar accommodating portion 32, a plurality of accommodation spaces 33 accommodating the bus bars 25 are provided in the assembled direction of the single cells 2. As shown also in FIG. 7, the adjoining accommodating spaces 33 are separated by partitions 34 to prevent contact between the adjoining bus bars 25. On each end portion of the main line 21 in the length direction, an accommodation space 33A accommodating the bus bar 25A connected with the power cable (not shown) is provided, and a power cable accommodating portion 36 is provided continuously with the accommodation space 33A.

Figure 7:
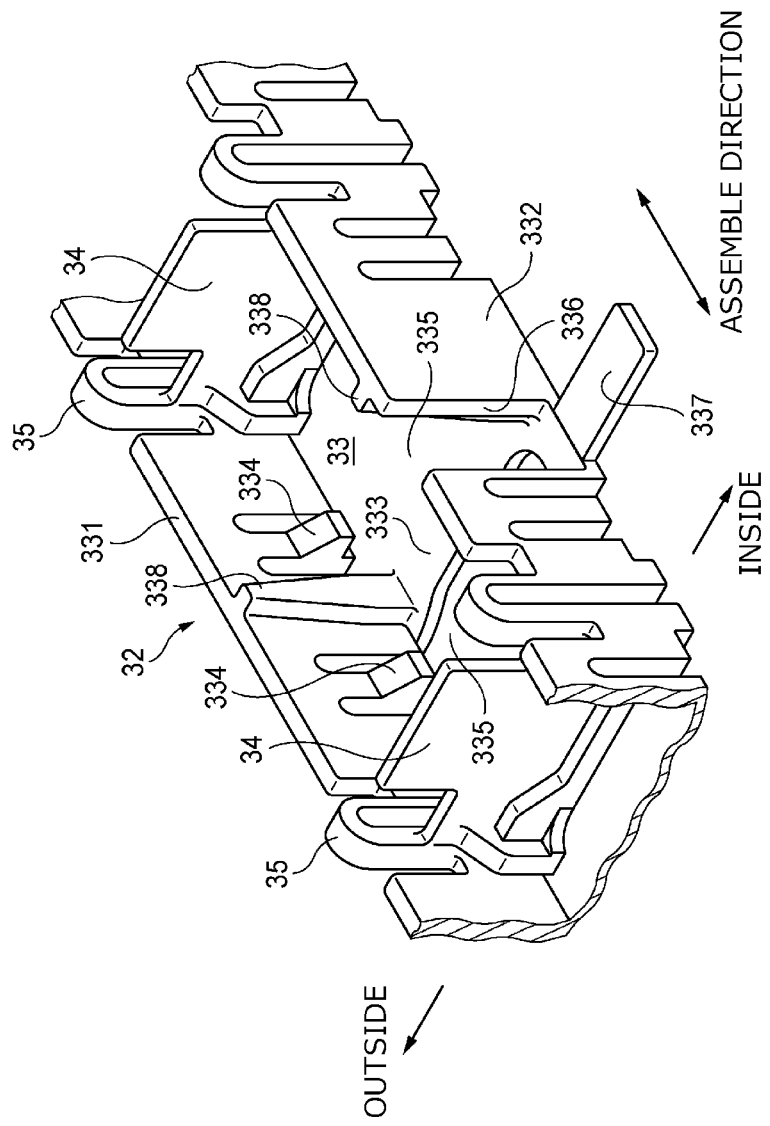
FIG. 7 is a perspective view of an accommodation space in a bus bar accommodating portion.

As shown in FIG. 7, the accommodation space 33 is a rectangular space that is open at the top and partitioned by an outer wall 331 on the outside and an inner wall 332 on the inside in the width direction, and a pair of partitions 34 on both sides in the assembled direction. One side of each partition 34 in the assembled direction (left side in FIG. 7) is connected to the outer wall 331 and the inner wall 332 through a stretching and shrinking portion 35. Consequently, the accommodation space 33 is stretchable and shrinkable in the assembled direction.

The lower end portion of the outer wall 331 and the lower end portion of the inner wall 332 are coupled by a coupling plate 333. On the lower end portion of the outer wall 331 and the lower end portion of the inner wall 332, engagement claws 334 are provided on both sides with the coupling plate 333 in between. This enables the bus bar 25 to be held between the coupling plate 333 and the engagement claws 334. Moreover, on the inner side surface of the outer wall 331 and the inner side surface of the inner wall 332, projections 338 are provided so as to project inward in a central portion in the assembled direction. These projections 338 are fitted in the positioning concave portions 254 of the bus bar 25 (see FIG. 5A) to position the bus bar 25.

The inner wall 332 is provided with a cut part 336, and in correspondence with the cut part 336, a support plate 337 is provided so as to project inward. Thereby, the connection piece 252 of the bus bar 25 accommodated in the accommodation space 33 is supported by the support plate 337.

Moreover, on each side of the coupling plate 333 in the coupling direction, a space 335 is provided. Consequently, the positive electrode 4 and the negative electrode 5 of the single cell 2 can be exposed to the inside of the accommodation space 33 from the space 335, so that they can be connected to the electrode holes 253 of the bus bar 25 accommodated in the accommodation space 33. Instead of the coupling plate 333, a bottom plate may be provided where cut parts or holes corresponding to the positive electrode 4 and the negative electrode 5 of the single cell 2 are provided.

As shown in FIG. 1, the holder 30 accommodates and holds a part of the circuit body 20 situated on the rear of a position a predetermined length behind the front end of the main line 21 to which the connector 212 is attached (in other words, of the circuit body 20, a part within a range where at least the position of branch of the main line 21 and the first branch portion 22 is present). In other words, the part of a predetermined length from the front end of the main line 21 to which the connector 212 is attached (hereinafter, referred to as "exposed part 213") is not accommodated in the holder 30 but exposed from the holder 30.

(Operation of the Bus Bar Module)

Next, the operation of the bus bar module 10 will be described. FIG. 5A shows a condition where the second branch line is bent in an S shape as a whole, FIG. 5B shows a condition where the second branch line slightly stretches rearward, and FIG. 5C shows a condition where the second branch line stretches forward.

As described above, the main line 21 is routed on the main line support members 311 of the holder 30, and movable upward and in the length direction. Moreover, the bus bar 25 is fixed to the inside of the accommodation space 33 of the holder 30, and the accommodation space 33 is movable in the length direction of the main line 21. The main line 21 and the bus bar 25 are connected through the second branch portion 23 bent in an S shape (see FIG. 5A).

Even if the relative positions of the battery assembly 1 and the circuit body 20 are changed, for example, due to a deformation of the battery assembly 1 under this condition and this changes the relative positions of the main line 21 and the bus bars 25, the changes (shifts) of the relative positions can be absorbed by the bending and stretching of the second branch portions 23. Likewise, even if the size of the battery assembly 1 in the assembled direction differs among the manufactured battery assemblies 1 due to the assembly tolerances of a plurality of single cells 2, the manufacturing variations can be absorbed by the bending and stretching of the second branch portions 23.

Figure 5B:
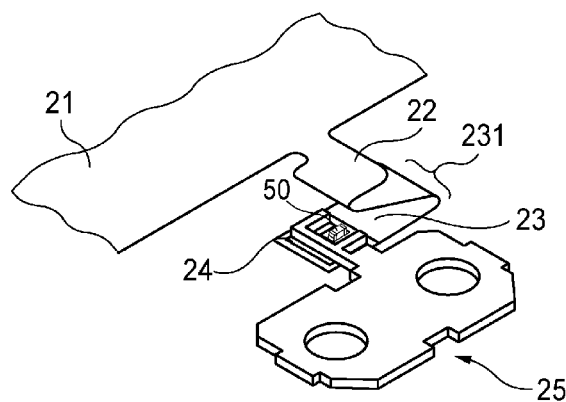
FIG. 5B is a perspective view showing a shape into which the second branch portion is deformed when the bus bar relatively moves rearward.
Figure 5C:
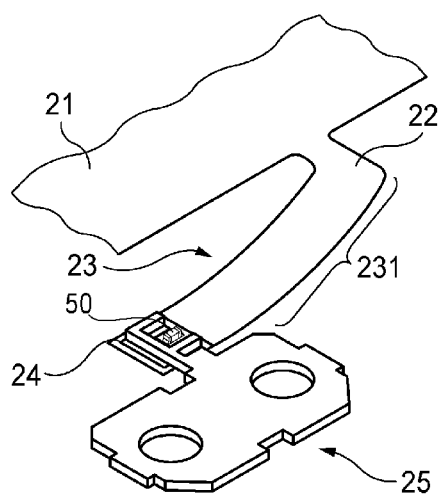
FIG. 5C is a perspective view of a condition where the bus bar relative moves forward so that the second branch portion stretches.

More specifically, FIG. 5B shows a case where the bus bar 25 is slightly shifted rearward (rightward in FIG. 5B) with respect to the main line 21. In this case, the S shape of the folded portion 231 of the second branch portion 23 is deformed to thereby allow the shift of the bus bar 25. Moreover, FIG. 5C shows a case where the bus bar 25 is largely shifted forward (leftward in FIG. 5C) with respect to the main line 21. In this case, the S shape of the folded portion 231 of the second branch portion 23 stretches to allow the shift of the bus bar 25. Although not shown, when the main line 21 moves upward or downward to change the position relative to the bus bar 25, the S shape of the folded portion 231 stretches in the vertical direction to thereby allow the change of the relative position.

Figure 8A:
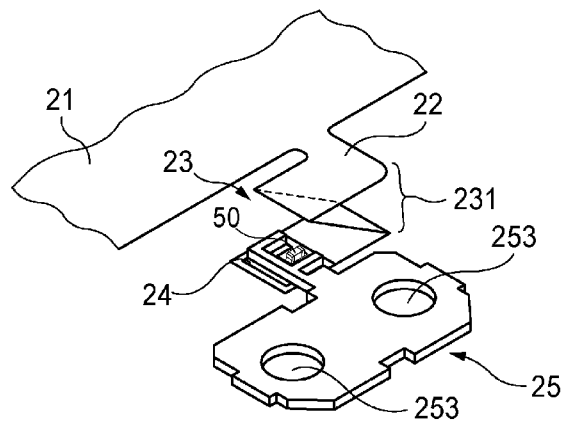
FIGS. 8A to 8C are perspective views showing modifications of a folded portion of the second branch portion constituting the circuit body.
Figure 8B:
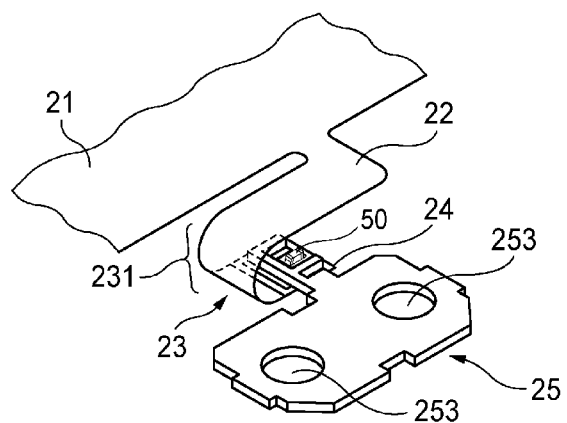
Figure 8C:
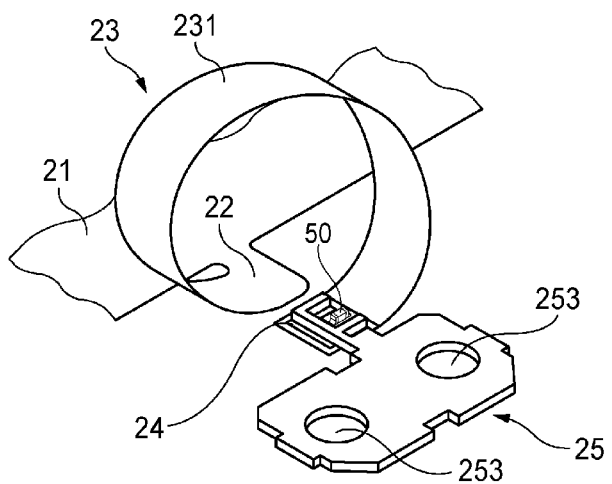

In the above-described embodiment, a case is described where the folded portions 231 of the second branch portions 23 are bent in an S shape (including an inverted S shape) as a whole. In addition, as shown in FIG. 8A, the folded portions 231 may be folded in a Z shape (including an inverted Z shape) as a whole. Moreover, as shown in FIG. 8B, the folded portions 231 may be formed in a C shape (including an inverted C shape) as a whole. Further, as shown in FIG. 8C, the folded portions 231 may be formed in an O shape as a whole. As in the example shown in FIG. 8C, the branch lines 22 and 23 may be configured so that the lower surface of the main line 21 and the lower surfaces of the connection portions 24 are flush with each other as required.

Figure 9A:
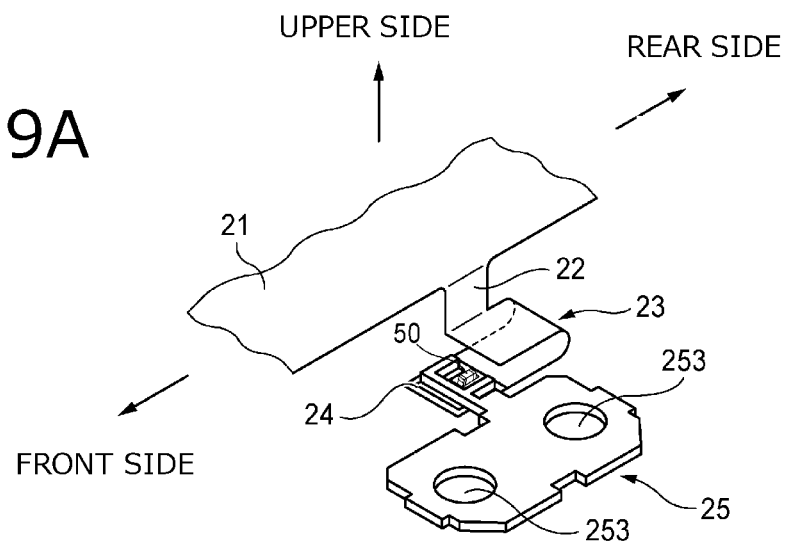
FIG. 9A is a perspective view showing a modification of the first branch portion.
Figure 9B:
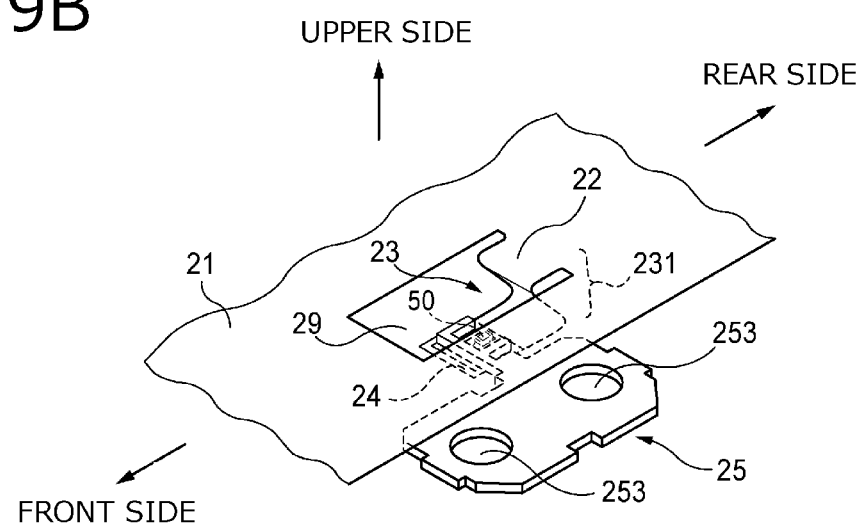
FIG. 9B is a perspective view showing a modification of a position of branch of the main line and the branch line.

Moreover, for example, in the above-described embodiment, a case is described where the first branch portions 22 extend on the same plane as the main line 21; however, as shown in FIG. 9A, the first branch portions 22 may be provided in a direction intersecting with the lower surface of the main line 21 (for example, a downward direction orthogonal to the main line 21 in FIG. 9A). Further, for example, in the above-described embodiment, a case is described where the first branch portions 22 branch from side portions of the main line 21, as shown in FIG. 9B, an opening 29 may be provided in a central area different from the side portions of the main line 21 so that the first branch portions 22 branch from the central area of the main line 21.

(Internal Structure of the Main Line and the Branch Lines Constituting the Circuit Body)

Next, referring to FIGS. 11B, 14A, 14B and 17, the internal structure of the main line 21, the first branch portions 22 and the second branch portions 23 constituting the circuit body 20 will be described.

As described above, the main line 21, the first branch portions 22 and the second branch portions 23 constituting the circuit body 20 are formed of an FPC. As shown in FIG. 11B, (the FPC constituting) the circuit body 20 is formed of a resin layer 201, and an upper side metal layer 203a and a lower side metal layer 203b so as to be sandwiched in the resin layer 201. Typically, the resin layer 201 is made of polyimide, and the upper side metal layer 203a and the lower side metal layer 203b are made of copper (Cu). As described later, in the present embodiment, a conventionally required reinforcing plate for suppressing curving and the like of the circuit body 20 can be omitted by supporting the circuit body 20 with the bus bars 25. In actuality, the circuit body 20 is provided with an adhesive layer (not shown) that tightly fixes these layers together. However, for convenience of explanation, the illustration of the adhesive layer is omitted in FIG. 11B.

The upper side metal layer 203a situated on the upper side (obverse side) of the center of the resin layer 201 in the thickness direction and the lower side metal layer 203b situated on the lower side (reverse side) of the center of the resin layer 201 in the thickness direction are embedded inside the resin layer 201. The upper side metal layer 203a and the lower side metal layer 203b are separated from each other in the thickness direction of the resin layer 201, and the resin layer 201 is interposed therebetween. That is, the upper side metal layer 203a and the lower side metal layer 203b are insulated from each other.

Figure 16A:
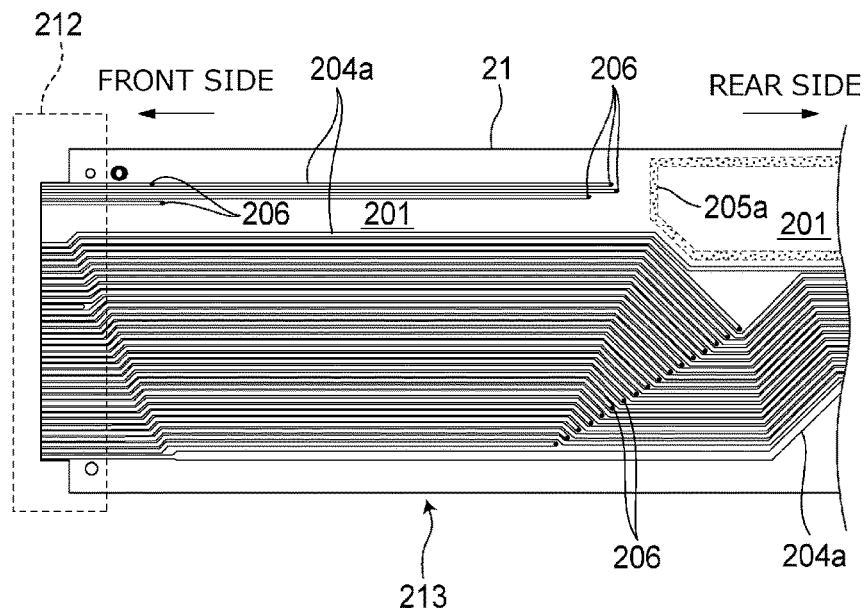
FIG. 16A is a cross-sectional view corresponding to the upper side metal layer in the periphery of the front end portion of the circuit body.

As shown in FIGS. 14A and 16A, the upper side metal layer 203a forms upper side wiring patterns 204a as part of the above-mentioned plurality of wiring patterns, upper side dummy patterns 205a independent of the upper side wiring patterns 204a and the above-described connection portions 24 independent of the upper side wiring patterns 204a.

Figure 16B:
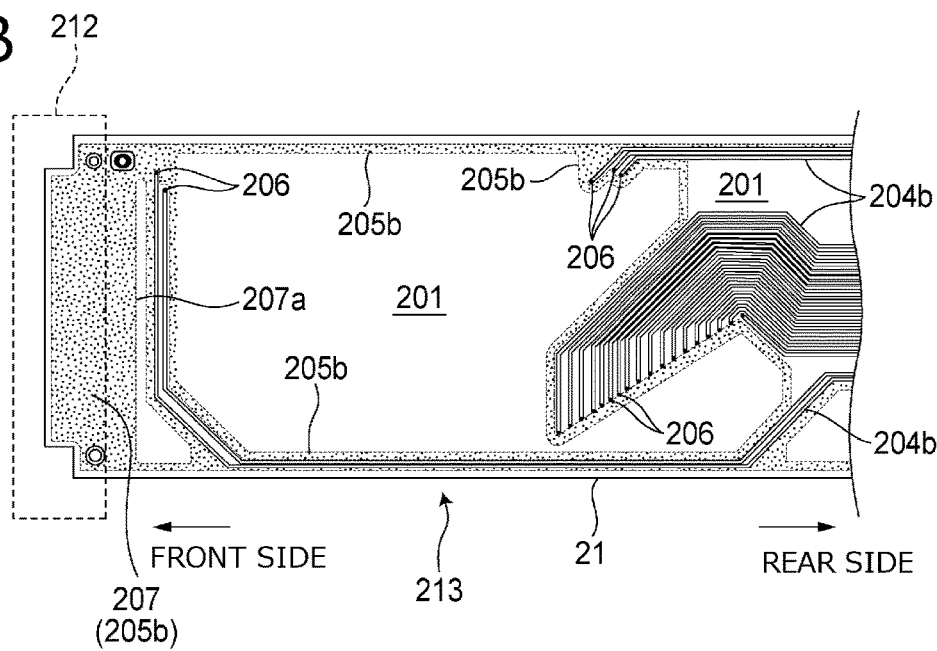
FIG. 16B is a cross-sectional view corresponding to the lower side metal layer in the periphery of the front end portion of the circuit body.

As shown in FIGS. 14B and 16B, the lower side metal layer 203b forms lower side wiring patterns 204b as the remaining part of the above-mentioned plurality of wiring patterns and lower side dummy patterns 205b independent of the lower side wiring patterns 204b. The corresponding upper side wiring patterns 204a and lower side wiring patterns 204b are interconnected so as to be electrically continuous with each other in the thickness direction of the circuit body 20 through corresponding via holes 206 (see FIGS. 14A, 14B, 16A and 16B).

As shown in FIGS. 14A, 14B, 16A and 16B, regarding the first and second branch portions 22 and 23, on one side in the width direction (the right side in FIGS. 14A and 14B), of the plurality of first branch portions 22 and second branch portions 23 provided on both sides of the main line 21 in the width direction, the corresponding upper side wiring patterns 204a continuously extend from the neighborhood of the tail end portions of the second branch portions 23 by way of the first and second branch portions 22 and 23 and the main line 21 over to the connector 212 connected to the front end portion of the circuit body 20, whereby the first and second branch portions 22 and 23 and the connector 212 are connected so as to be electrically continuous.

On the other hand, regarding the first and second branch portions 22 and 23, on the other side in the width direction (the left side in FIGS. 14A and 14B), of the first and second branch portions 22 and 23, first, as shown in FIG. 14A, the corresponding upper side wiring patterns 204a extend from the neighborhood of the tail end portions of the second branch portions 23 by way of the first and second branch portions 22 and 23 up to the via holes 206 in the neighborhood of the first branch portions 22 on the main line 21. And as shown in FIG. 14B, from the via holes 206, the corresponding lower side wiring patterns 204b extend up to the via holes 206 (see FIG. 16B) in the neighborhood of the connector 212 on the main line 21. Further, as shown in FIG. 16A, from the via holes 206, the corresponding upper side wiring patterns 204a extend up to the connector 212, whereby the first and second branch portions 22 and 23 and the connector 212 are connected so as to be electrical continuous. That is, at the portion of connection with the connector 212 on the main line 21, the upper side wiring patterns 204a corresponding to all the first and second branch portions 22 and 23 provided on both sides in the width direction are connected to the connector 212 (see FIG. 16B), and no lower side wiring patterns 204b connected to the connector 212 are present (see FIG. 16B).

By bringing the upper side wiring patterns 204a and the lower side wiring patterns 204b together to the connector 212 by using both the upper side metal layer 203a and the lower side metal layer 203b as described above, a plurality of wirings extending from a plurality of bus bars 25 can be connected to the connector 212 while being rearranged in the order corresponding to the order of arrangement of the single cells 2 (see FIG. 2). That is, the wiring patterns can be arranged in the order of potentials.

As shown in FIGS. 14A, 14B, 16A and 16B, the upper side dummy patterns 205a and the lower side dummy patterns 205b are formed, mainly, in the nearly entire area except the area occupied by the upper side wiring patterns 204a and the lower side wiring patterns 204b in the part of the main line 21 accommodated in the holder 30 (that is, the part except the exposed part 213). The upper side dummy patterns 205a and the upper side wiring patterns 204a, and the lower side dummy patterns 205b and the lower side wiring patterns 204b are disposed away from each other so as not to be electrically continuous. These upper side dummy patterns 205a and lower side dummy patterns 205b are provided mainly in order that the stiffness of the part of the main line 21 accommodated in the holder 30 (that is, the part except the exposed part 213) is higher than that of the first and second branch portions 22 and 23.

Further, as shown in FIG. 16B, the lower side dummy patterns 205b (hereinafter, referred to particularly as "connector connection portion dummy patterns 207") are formed in a predetermined area in the length direction and substantially over the entire area in the width direction at the portion of connection between the main line 21 and the connector 212. In other words, the connector connection portion dummy patterns 207 are provided so as to be multilayered with respect to the upper side wiring patterns 204a connected to the connector 212.

Since a multiplicity of upper side wiring patterns 204a are densely connected to the connector 212 as described above, the points of contact between the terminals incorporated in the connector 212 and the upper side wiring patterns 204a are also dense. For this reason, the heat caused by the contact resistance at each point of contact concentrates in a small space in the connector 212. It is desirable to release this heat to the outside of the connector 212. In this regard, since the connector connection portion dummy patterns 207 made of a metal are high in thermal conductivity, the heat inside the connector 212 can be released to the outside through the connector connection portion dummy patterns 207. Therefore, by providing the connector connection portion dummy patterns 207, the performance of heat release from the connector 212 can be made higher than in a mode where no connector connection portion dummy patterns 207 are provided. In addition, since the stiffness of the main line 21 at the portion of connection with the connector 212 can be made higher by providing the connector connection portion dummy patterns 207 than in the mode where no connector connection portion dummy patterns 207 are provided, for example, separation of the point of contact between the terminals and the upper side wiring patterns 204a due to curving of the main line 21 can be suppressed.

Figure 17:
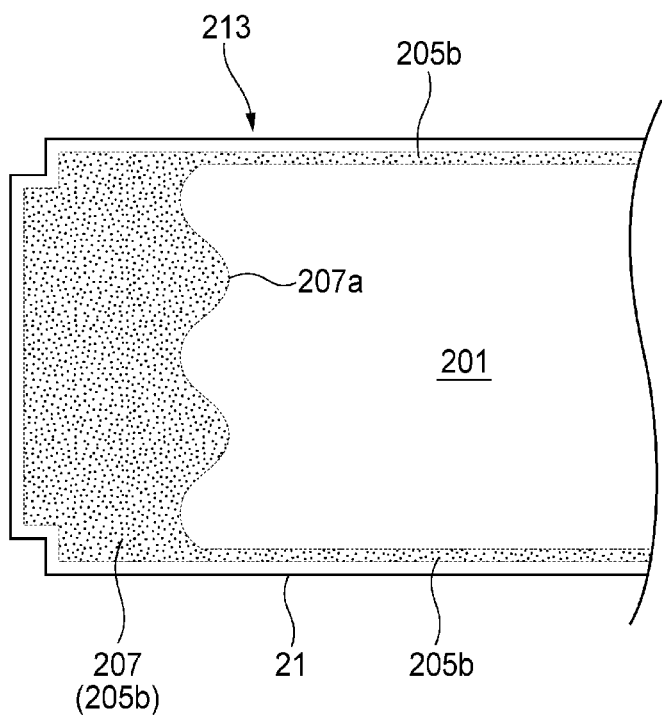
FIG. 17 is a cross-sectional view corresponding to FIG. 16B at the front end portion of the circuit body according to another modification of the present embodiment.

In the example shown in FIG. 16B, an edge portion 207a on the rear side (the side opposite to the side connected to the connector 212) on the connector connection portion dummy pattern 207 is linear in shape. This makes the manufacture of the connector connection portion dummy patterns 207 comparatively easy. On the contrary, as shown in FIG. 17, the edge portion 207a may be corrugated in shape. With this, the occurrence of stress concentration inside the connector connection portion dummy patterns 207 when the main line 21 of the circuit body 20 is curved can be avoided as much as possible.

Figure 15:
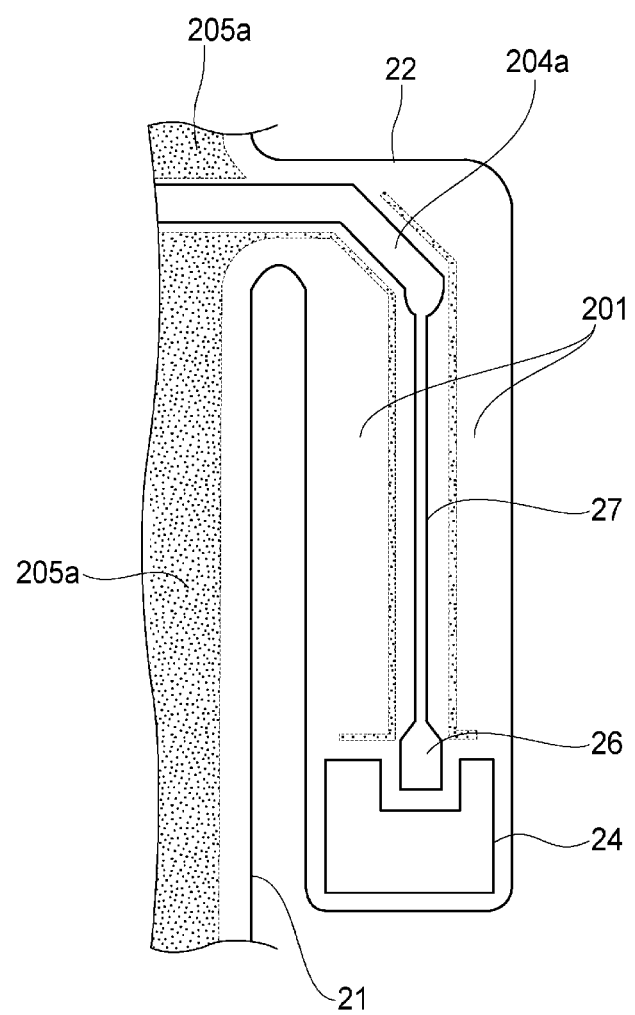
FIG. 15 is a cross-sectional view where the periphery of one branch portion on the circuit body shown in FIG. 14A is enlarged.

Next, as shown in FIG. 14A, the connection portion 24 is formed on the tail end portion of each of the second branch portions 23 on all the first and second branch portions 22 and 23 provided on both sides of the main line 21 in the width direction. As shown in FIG. 15, the connection portion 24 is disposed so as to be separate from a tail end portion 26 of the upper side wiring pattern 204a on the second branch portion 23. As described later, the bus bar 25 is connected to the connection portion 24 and a chip fuse 50 is disposed so as to bridge between the tail end portion 26 and the connection portion 24 (see FIG. 10, etc.), whereby the bus bar 25 and the connector 212 are connected so as to be electrically continuous.

As shown in FIG. 15, a thin portion 27 where the width (that is, the cross-sectional area) of the wiring pattern is relatively small is formed on the upper side wiring pattern 204a on the second branch portion 23. Thereby, even if excessive current flows at a specific wiring pattern for various reasons and the chip fuse 50 does not function, the thin portion 27 corresponding to the wiring pattern melts more preferentially than the remaining part of the upper side wiring pattern 204a because of the Joule heat caused by the excessive current. Thus, the remaining part of the upper side wiring pattern 204a (particularly, the part where the upper side wiring patterns 204a are dense on the main line 21) melts, so that adverse effects on the peripheral wirings and the like can be suppressed. Since the molten thin portion 27 is trapped in the resin layer 201, scattering around of the metal forming the thin portion 27 can be suppressed.

(Concrete Form of Connection Between the Connection Piece of the Bus Bar and the Connection Portion of the Branch Line)

Next, referring to FIGS. 10, 11A and 11B, a concrete form of connection between the connection piece 252 of the bus bar 25 and the connection portion 24 of the second branch portion 23 will be described.

Figure 10:
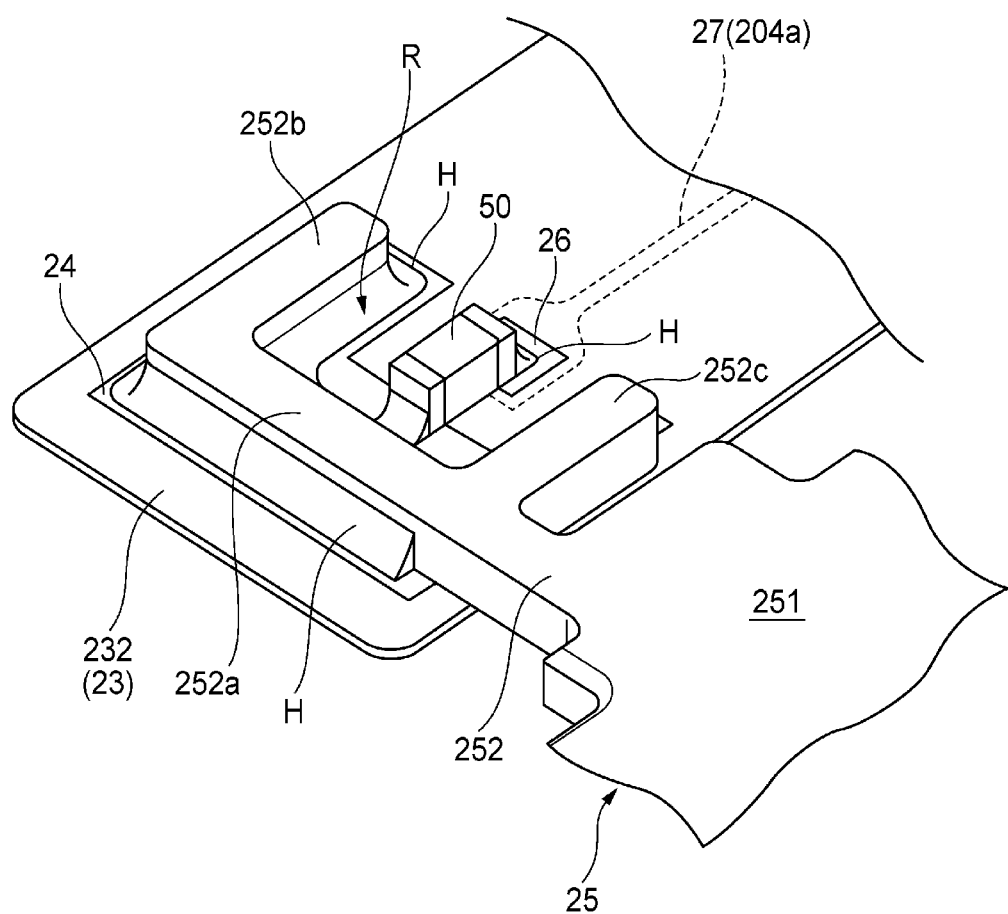
FIG. 10 is a perspective view where the periphery of the position of contact between a connection piece of the bus bar and a connection portion of the second branch portion is enlarged.
Figure 11A:
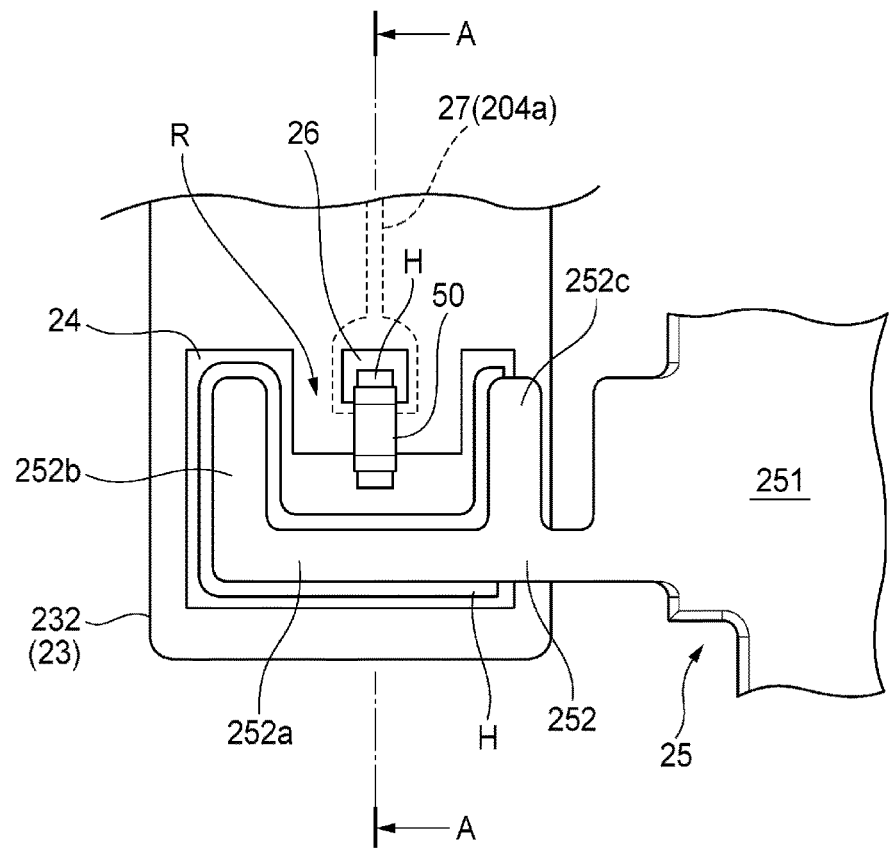
FIG. 11A is a top view of the periphery of the connection position shown in FIG. 10.
Figure 11B:
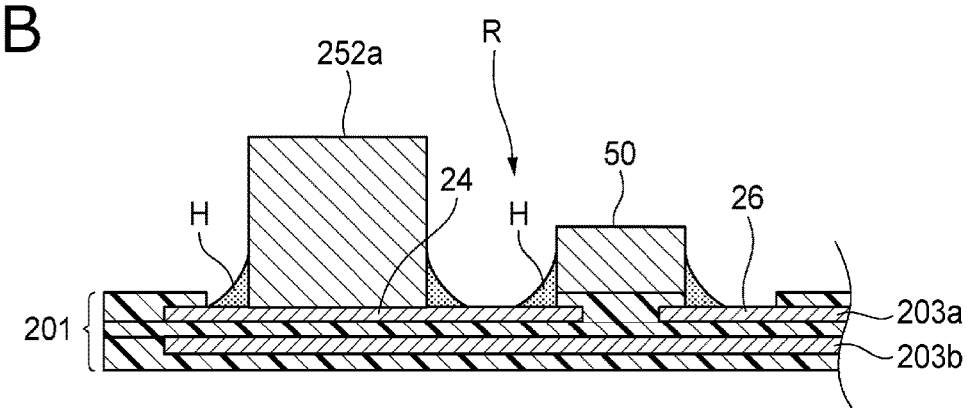
FIG. 11B is an A-A cross-sectional view of FIG. 11A.

As shown in FIGS. 10, 11A and 11B, in the area, corresponding to the connection portion 24 and the tail end portion 26, on the upper surface of the leading end portion 232 of the second branch portion 23, the resin layer 201 (see FIG. 11B) constituting the circuit body 20 is removed. As a result, on the upper surface of the leading end portion 232, the substantially U-shaped connection portion 24 and the rectangular tail end portion 26 are exposed so as to be open at the top.

The connection piece 252 of the bus bar 25 is formed of a first portion 252a extending from the bus bar body 251 toward the inside in the width direction (the side of the main line 21) and a pair of second portions 252b and 252c extending rearward from the leading end portion and the base portion of the first portion 252a. As a result, the connection piece 252 has a substantial U shape that is open to the rear corresponding to the shape of the exposed connection portion 24.

The connection piece 252 (which has the first portion 252a and the second portions 252b and 252c) is fixed to the upper surface of the exposed connection portion 24 over the entire area so that the substantial U shapes thereof coincide with each other. In this example, such fixing is made by using solder H. As a result, the connection portion 24 and the bus bar 25 are connected so as to be electrically continuous, and by using the stiffness of the connection piece 252, an area (curving restricted area) R where the curving of the second branch portion 23 is restricted is formed in a rectangular part sandwiched by the pair of second portions 252b and 252c.

In this curving restricted area R, the chip fuse 50 is attached so as to bridge between the tail end portion 26 and the connection portion 24. Specifically, one of the electrodes on both end portions of the chip fuse 50 is fixed to the exposed connection portion 24, and the other thereof is fixed to the exposed tail end portion 26. In this example, such fixing is made by using solder H. As a result, the connection portion 24 (consequently, the bus bar 25) and the tail end portion 26 (consequently, the connector 212) are connected so as to be electrically continuous.

As described above, the curving restricted area R is formed by the connection piece 252 of the bus bar 25, and the chip fuse 50 is mounted in this area. Thereby, curving of the second branch portion 23 in the mounting area of the chip fuse 50 can be suppressed without the provision of a reinforcing plate or the like.

Figure 12A:
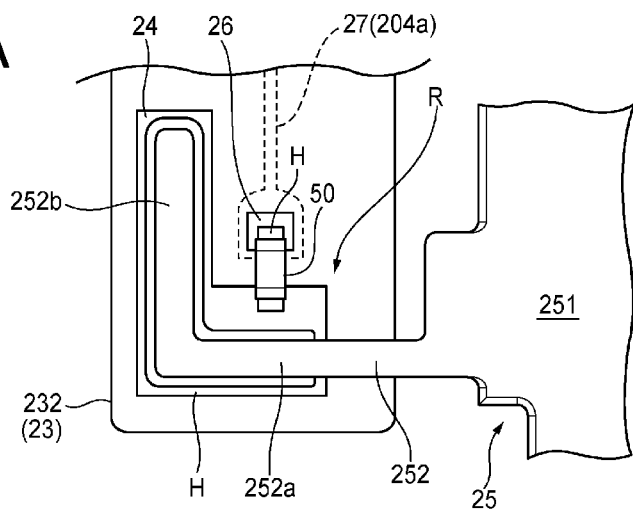
FIG. 12A is a view, corresponding to FIG. 11A, of the bus bar module according to a modification of the present embodiment.
Figure 12B:
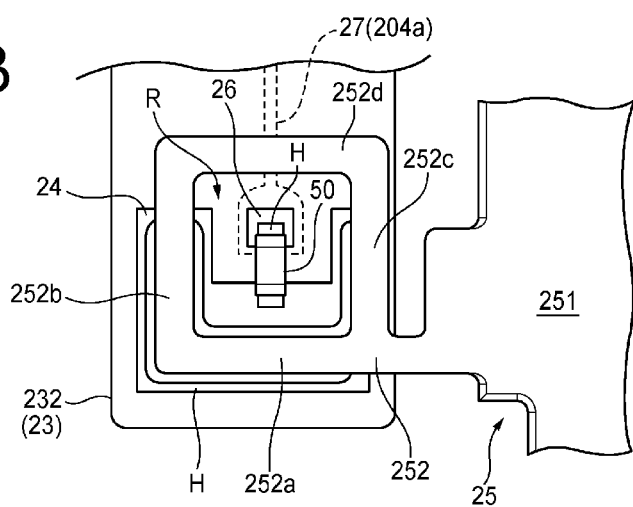
FIG. 12B is a view, corresponding to FIG. 11A, of the bus bar module according to another modification of the present embodiment.
Figure 12C:
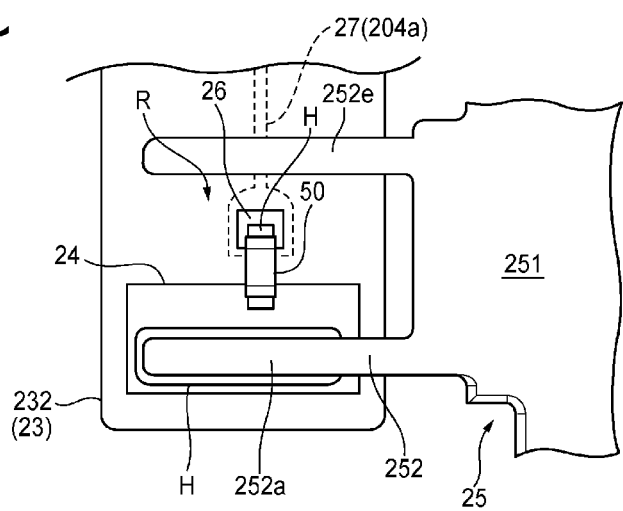
FIG. 12C is a view, corresponding to FIG. 11A, of the bus bar module according to still another modification of the present embodiment.

As shown in FIG. 12A, the connection piece 252 may have an L shape where the second portion 252*c* is omitted from the mode shown in FIG. 11A. Moreover, as shown in FIG. 12B, the connection piece 252 may have a rectangular shape where a third portion 252*d* coupling the leading ends of the pair of second portions 252*b* and 252*c* is further provided in the mode shown in FIG. 11A. Further, as shown in FIG. 12C, the connection piece 252 may be formed of two first portions 252*a* and 252*e* from the bus bar body 251. In any of the modes, since the chip fuse 50 is attached within the curving restricted area R using the stiffness of the connection piece 252, curving of the second branch portion 23 in the mounting area of the chip fuse 50 can be suppressed.

Figure 13A:
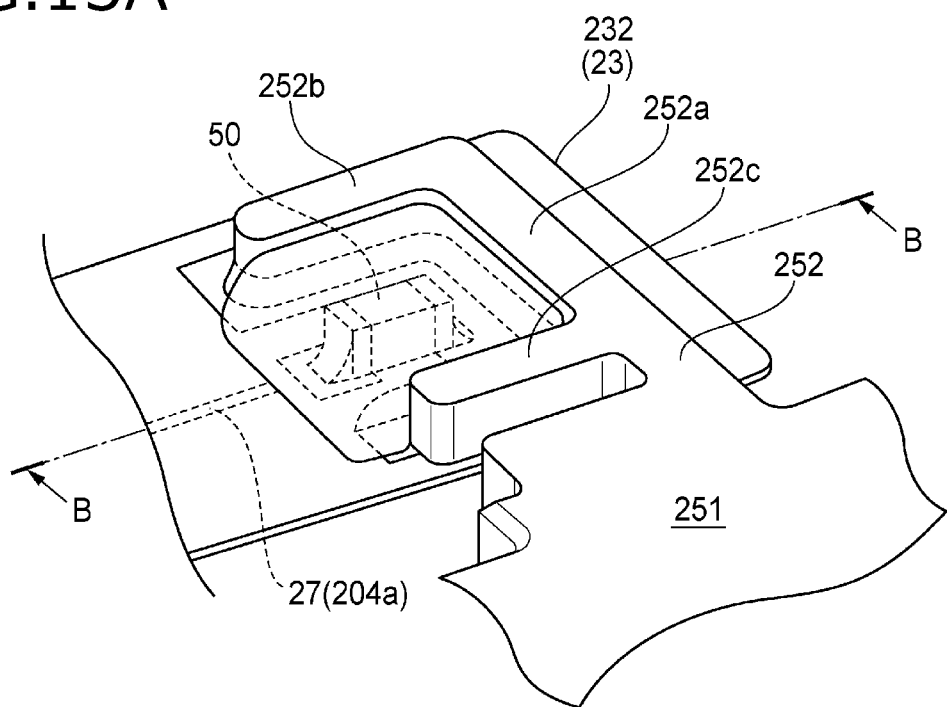
FIG. 13A is a perspective view where the periphery of the position of connection between the connection piece of the bus bar and the connection portion of the second branch portion on the bus bar module according to another modification of the present embodiment is enlarged.
Figure 13B:
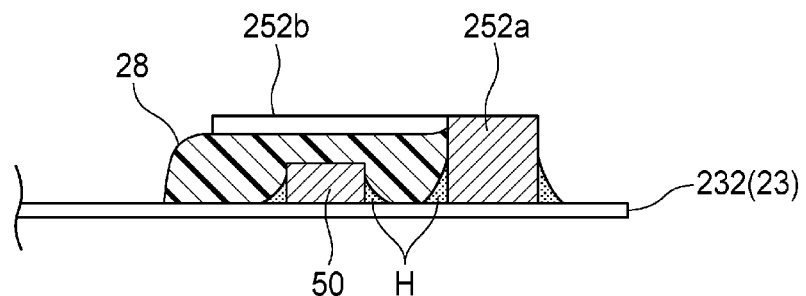
FIG. 13B is a B-B cross-sectional view of FIG. 13A.

Further, as shown in FIGS. 13A and 13B, a potting member 28 may be provided so as to cover the chip fuse 50 so that it is separated from the outside in the curving restricted area R formed by the connection piece 252 by using the structure such that the height of the connection piece 252 (which has the first portion 252*a* and the second portions 252*b* and 252*c*) is larger than the height of the chip fuse 50 (see FIG. 11B).

As described above, by the potting member 28 covering the chip fuse 50, the waterproofing property of the chip fuse 50 and the electric contacts around the chip fuse 50 can be enhanced. Further, by the potting member 28 solidifying in a state of being in intimate contact with the surface of the leading end portion 232, curving of the second branch portion 23 can be further suppressed by using the stiffness of the potting member 28. It is desirable that the potting member 28 be provided so as to fill the entire curving restricted area R formed by the connection piece 252 of the bus bar 25.

(Cover Assembled to the Holder)

Figure 18A:
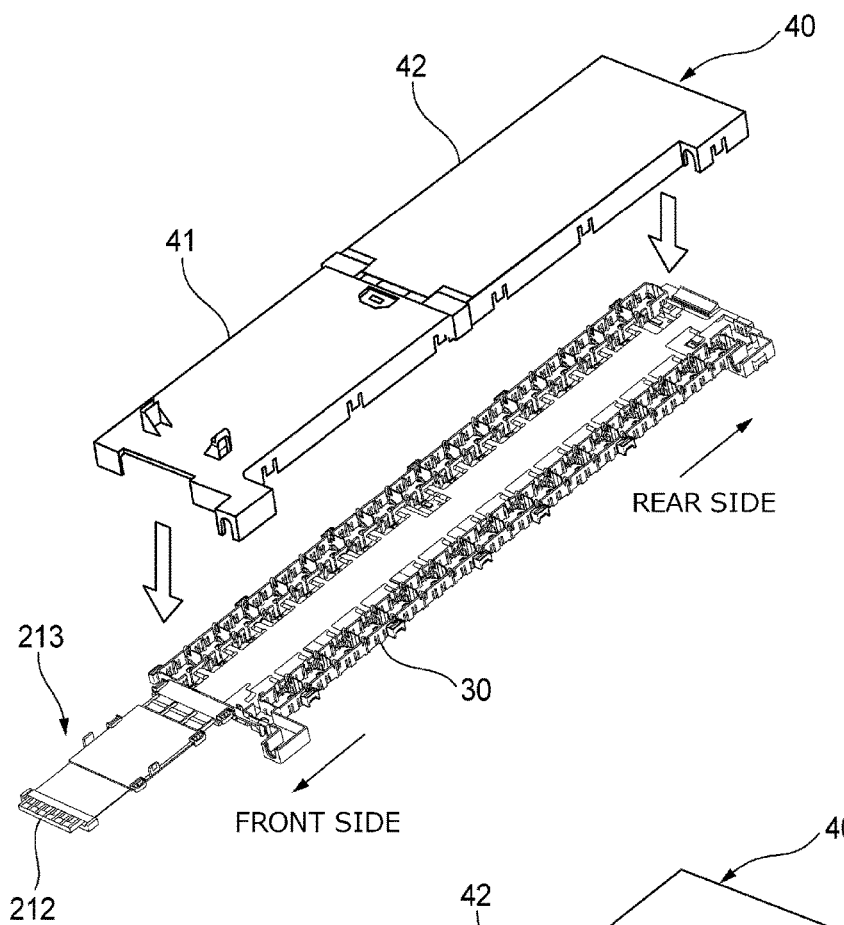
FIG. 18A is a perspective view showing a manner in which a cover is attached to the holder of the bus bar module.
Figure 18B:
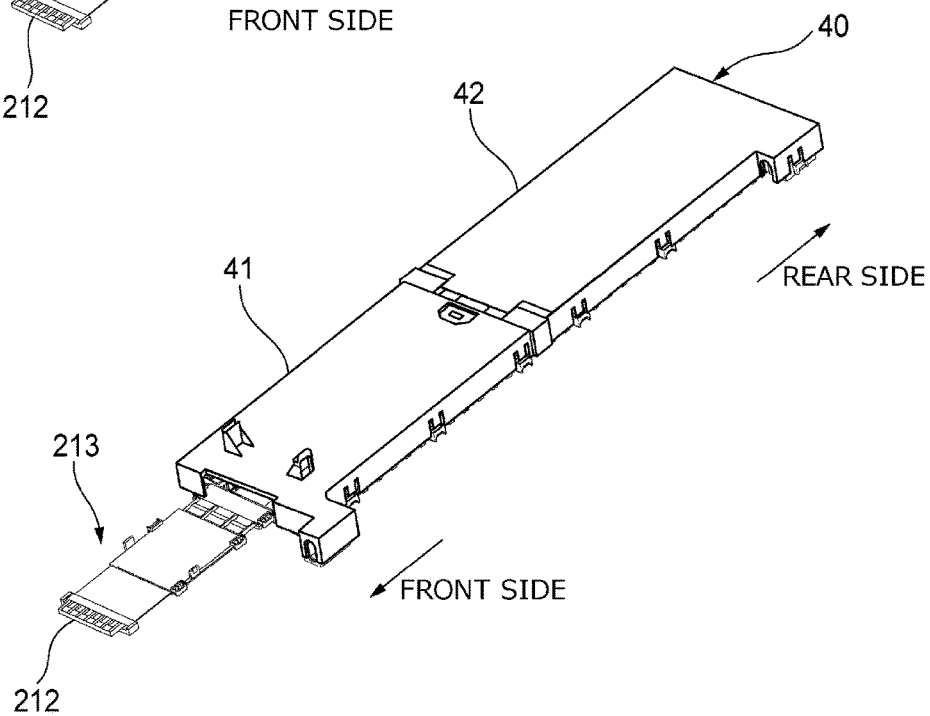
FIG. 18B is a perspective view showing the condition where the cover is attached to the holder of the bus bar module.

Next, referring to FIGS. 18A and 18B to 21A to 21C, a cover 40 assembled to the holder 30 will be described. As shown in FIGS. 18A and 18B, the cover 40 made of resin is assembled to the holder 30 accommodating the circuit body 20 from above so as to cover the circuit body 20 in order to protect the circuit body 20. Under the condition where the cover 40 is assembled to the holder 30, the exposed part 213 of the circuit body 20 is exposed to the outside from the space covered with the holder 30 and the cover 40 (see FIG. 18B).

As described above, the holder 30 is stretchable and shrinkable in the front-rear direction (the assembled direction of the battery assembly 1). For this reason, it is desirable that the cover 40 be also configured so as to be stretchable and shrinkable in the front-rear direction. In this regard, the cover 40 is formed of two portions arranged in the front-rear direction (that is, a front side portion 41 and a rear side portion 42), and the front side portion 41 and the rear side portion 42 are coupled so as to be movable relatively to each other in the front-rear direction. Hereinafter, concrete structures of the front side portion 41 and the rear side portion 42 will be described.

Figure 20A:
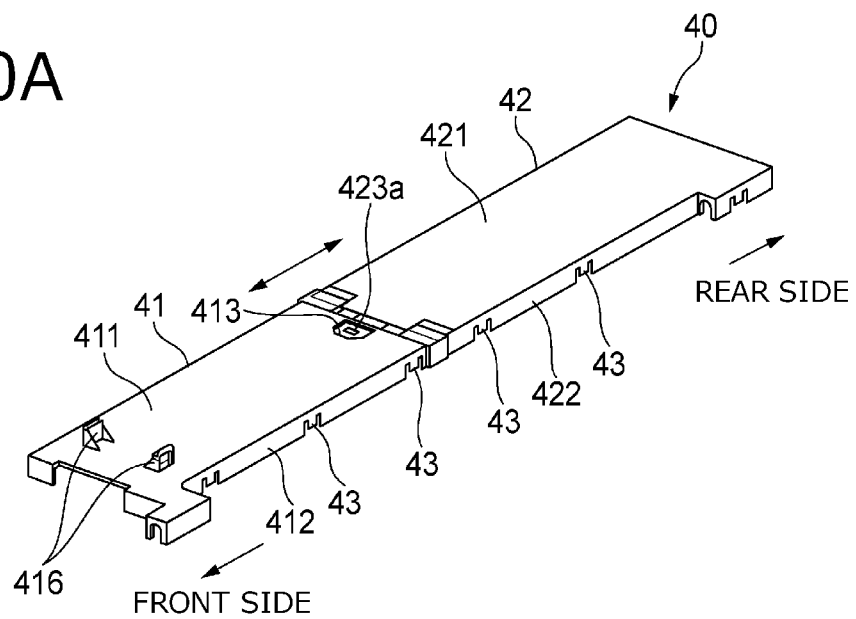
FIG. 20A is a perspective view of a cover in the assembled condition.
Figure 20B:
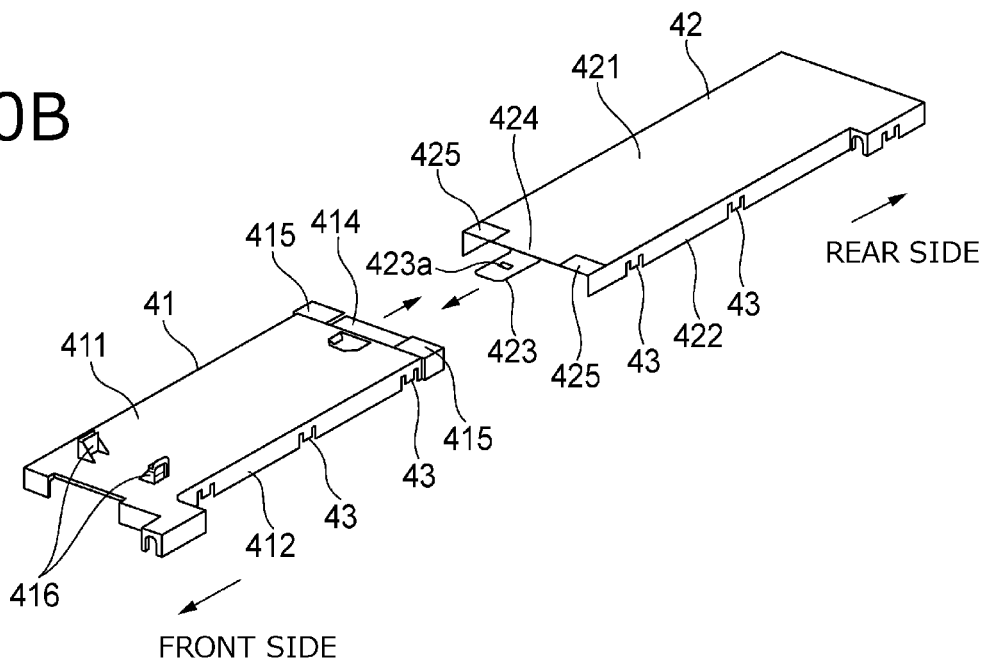
FIG. 20B is an exploded perspective view of the cover.

As shown in FIGS. 20A and 20B, the front side portion 41 is substantially formed of a rectangular plate form top plate portion 411 and a pair of side plate portions 412 hanging down from both sides of the top plate portion 411 in the width direction. The rear side portion 42 is also substantially formed of a rectangular plate form top plate portion 421 and a pair of side plate portions 422 hanging from both sides of the top plate portion 421 in the width direction.

Figure 19:
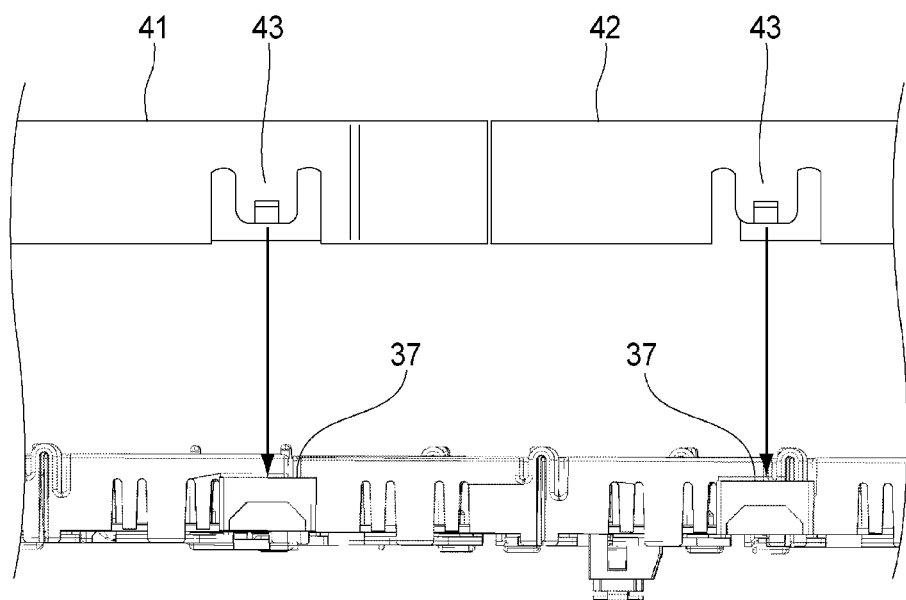
FIG. 19 is a side view for explaining the position of engagement between the holder and the cover.

As shown in FIG. 19, the side plate portions 412 of the front side portion 41 and the side plate portions 422 of the rear side portion 42 are provided with a plurality of engagement portions 43 so as to correspond to engagement portions 37 provided in a plurality of positions in the front-rear direction on both side walls of the holder 30 (see FIGS. 1 and 6). The corresponding engagement portions 37 of the holder 30 and engagement portions 43 of the cover 40 engage with each other, whereby the cover 40 (=the front side portion 41 and the rear side portion 42) is assembled to the holder 30.

As shown in FIGS. 20A and 20B, on the top plate portion 411 of the front side portion 41, an engagement hole (through hole) 413 is formed in a central portion in the width direction in the neighborhood of the rear end portion (the portion to be coupled to the rear side portion 42). Moreover, on the rear end portion of the top plate portion 411, a first coupling plate portion 414 is formed in a position slightly lower than the top plate portion 411 in a central portion in the width direction, and on both sides of the first coupling plate portion 414 in the width direction, a pair of second coupling plate portions 415 that are flush with the top plate portion 411 are formed.

On the top plate portion 421 of the rear side portion 42, a tongue-shaped piece 423 is formed that projects forward from a central portion of the front end portion (the portion to be coupled to the front side portion 41) in the width direction. On a central portion of the upper surface of the tongue-shaped piece 423, a projection 423*a* projecting upward is formed. Moreover, on the front end portion of the top plate portion 421, a first coupling plate portion 424 that is flush with the top plate portion 421 is formed in a central portion in the width direction, and on both sides of the first coupling plate portion 424 in the width direction, a pair of second coupling plate portions 425 are formed in positions slightly lower than the top plate portion 421.

Figure 21A:
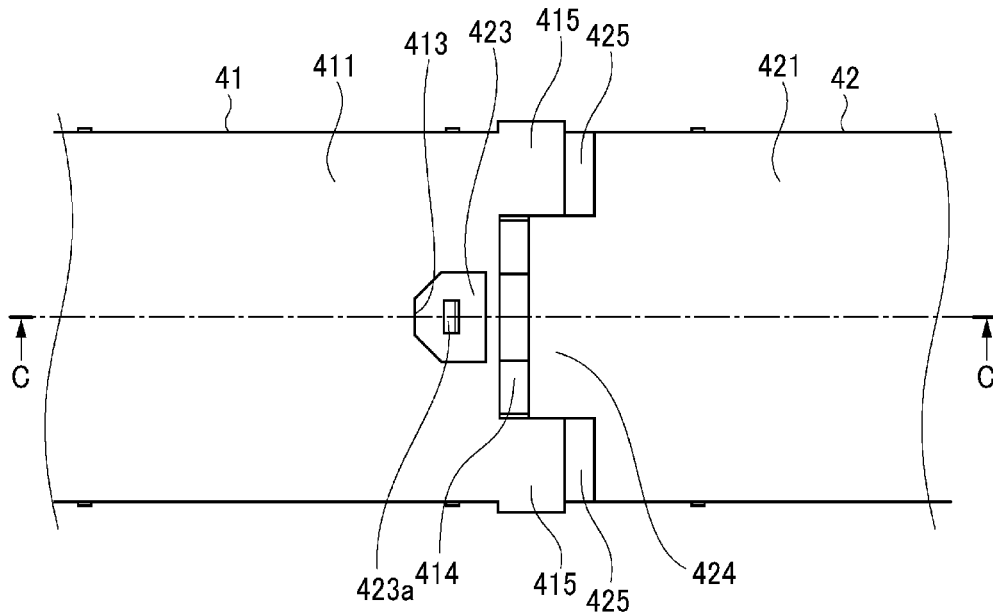
FIG. 21A is an upper view of the cover in the assembled condition.

Under a condition where the front side portion 41 and the rear side portion 42 are coupled together, as shown in FIGS. 20A and 21A, the tongue-shaped piece 423 of the rear side portion 42 enters the vertical gap between the top plate portion 411 and the first coupling plate portion 414 of the front side portion 41, and the projection 423*a* of the tongue-shaped piece 423 is situated inside the engagement hole 413. Moreover, the first coupling plate portion 414 enters below the first coupling plate portion 424 and the pair of second coupling plate portions 415 enters above the pair of second coupling plate portions 425, whereby the first coupling plate portion 414 and the first coupling plate portion 424 partially overlap with each other, and the pair of second coupling plate portions 415 and the pair of second coupling plate portions 425 partially overlap with each other.

Figure 21B:
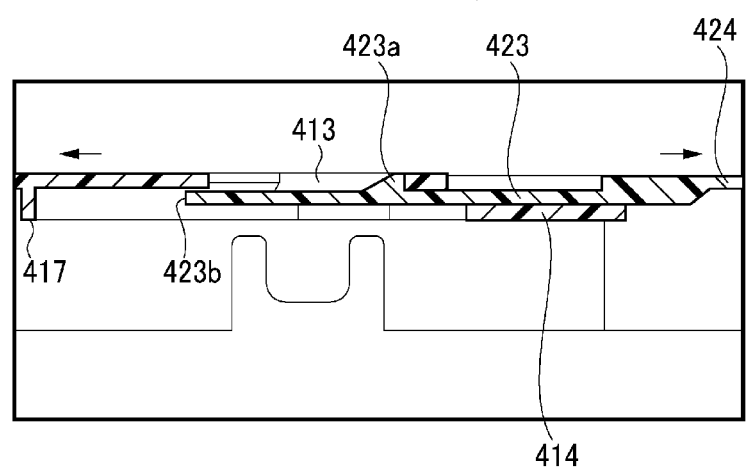
FIG. 21B is a cross-sectional view corresponding to the C-C cross section of FIG. 21A on the cover in the most stretched condition.
Figure 21C:
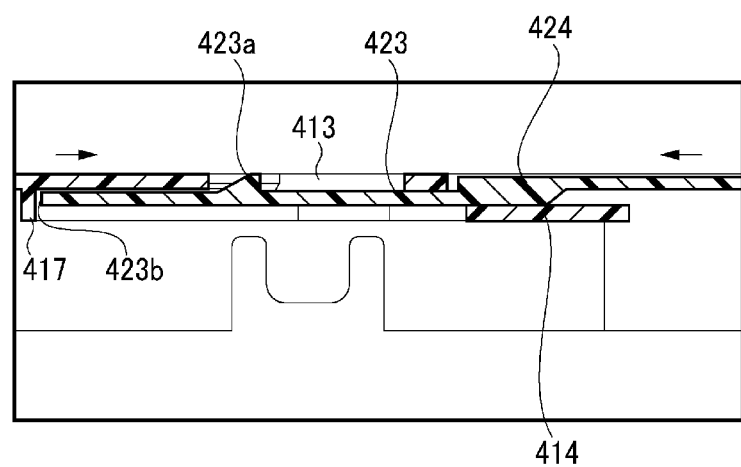
FIG. 21C is a cross-sectional view corresponding to the C-C cross section of FIG. 21A in the most shrunken condition.

Under a condition where the front side portion 41 and the rear side portion 42 are coupled together, the front side portion 41 and the rear side portion 42 are stretchable in the front-rear direction until the projection 423*a* abuts on the rear side end of the engagement hole 413 as shown in FIG. 21B, and are shrinkable in the front-rear direction until a leading end portion 423*b* of the tongue-shaped piece 423 abuts on a stopper wall 417 provided on the lower surface of the top plate portion 411 of the front side portion 41 as shown in FIG. 21C.

Thus, the cover 40 formed of the front side portion 41 and the rear side portion 42 coupled together is configured so as to be stretchable and shrinkable. As a consequence, the cover 40 also stretches and shrinks as the holder 30 stretches and shrinks, so that the circuit body 20 and the bus bars 25 can be protected from the outside while the assemblability to the battery assembly 1 and the conformability to the manufacturing variations are improved.

Further, in whichever position in the stretchable and shrinkable range the front side portion 41 and the rear side portion 42 are situated, the first coupling plate portion 414 and the first coupling plate portion 424 partially overlap with each other, and the pair of second coupling plate portions 415 and the pair of second coupling plate portions 425 partially overlap with each other. That is, in whichever position in the stretchable and shrinkable range the front side portion 41 and the rear side portion 42 are situated, the portion of coupling of the front side portion 41 and the rear side portion 42 is closed so that the inside and outside of the cover 40 do not communicate with each other. As a consequence, even if the cover 40 stretches or shrinks, the condition where the circuit body 20 and the bus bars 25 are protected from the outside can be maintained.

Further, since the cover 40 is configured so as to be stretchable and shrinkable, the degree of absorbing the manufacturing variations and the like at the engagement portions 37 of the holder 30 and the engagement portions 43 of the cover 40 can be made lower than that in a mode where the cover 40 cannot stretch or shrink. As a result, the engagement portions 37 of the holder 30 and the engagement portions 43 of the cover 40 can be made small.
(Protector Fixed to the Cover)

Next, referring to FIGS. 22 to 24A and 24B, a protector 70 fixed to the cover 40 will be described. The protector 70 made of resin is provided on the exposed part 213 of the circuit body 20 in order to protect the exposed part 213 of the circuit body 20.

Figure 23A:
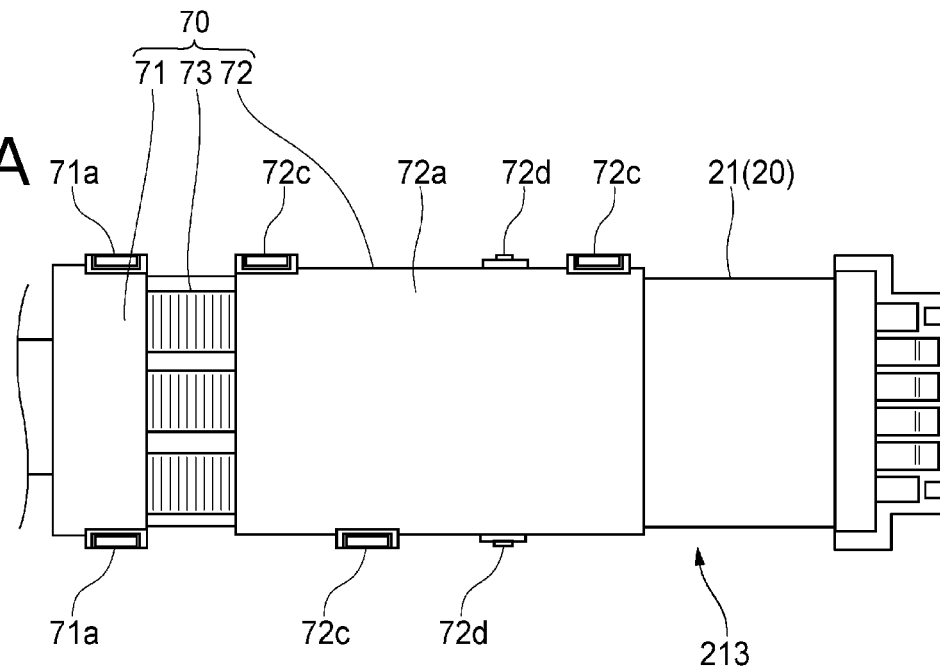
FIG. 23A is an upper view of the protector attached to the circuit body exposed from the cover.
Figure 23B:
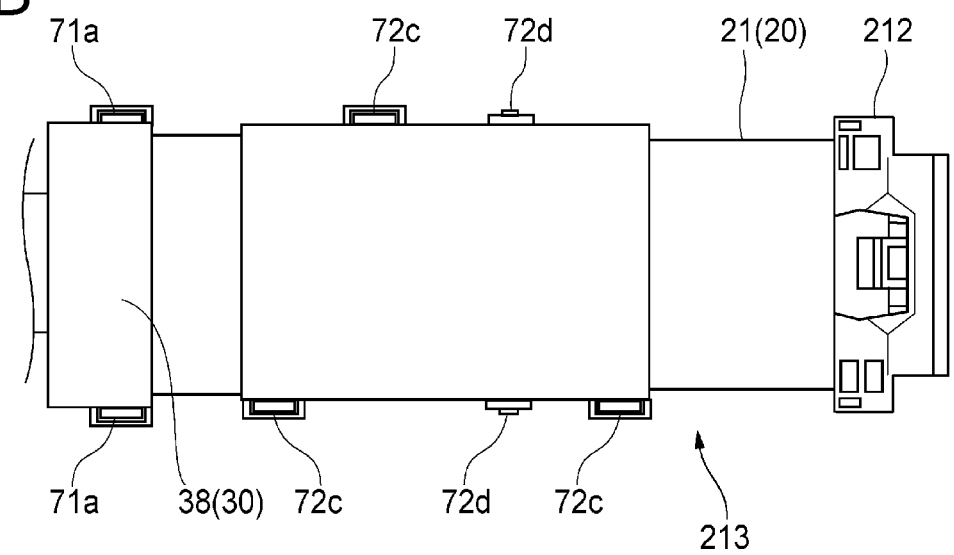
FIG. 23B is a lower view of the protector attached to the circuit body exposed from the cover.

As shown in FIGS. 23A and 23B, the protector 70 is formed of a base end side accommodation portion 71, a leading end side accommodation portion 72 and a coupling portion 73. The base end side accommodation portion 71 has a rectangular plate shape. Using engagement portions 71a on both sides in the width direction, the base end side accommodation portion 71 is assembled from above to be fixed to a front end portion 38 of the holder 30 accommodating the circuit body 20, so as to cover the base portion of the exposed part 213 of the circuit body 20. Thereby, the base portion of the exposed part 213 of the circuit body 20 is accommodated so as to be slidable in the length direction by the base end side accommodation portion 71 and the front end portion 38 of the holder 30.

The leading end side accommodation portion 72 is formed of a rectangular plate form upper side portion 72a and lower side portion 72b. The upper side portion 72a and the lower side portion 72b are assembled to each other so as to sandwich a central portion of the exposed part 213 of the circuit body 20 in the length direction by the upper side portion 72a and the lower side portion 72b by using engagement portions 72c on both sides in the width direction. Thereby, the central portion of the exposed part 213 of the circuit body 20 is accommodated so as to be slidable in the length direction by the leading end side accommodation portion 72 formed of the upper side portion 72a and the lower side portion 72b.

The coupling portion 73 is formed of a plurality of (in this example, three) bendable belts that couple the base end side accommodation portion 71 and the upper side portion 72a of the leading end side accommodation portion 72.

Figure 22:
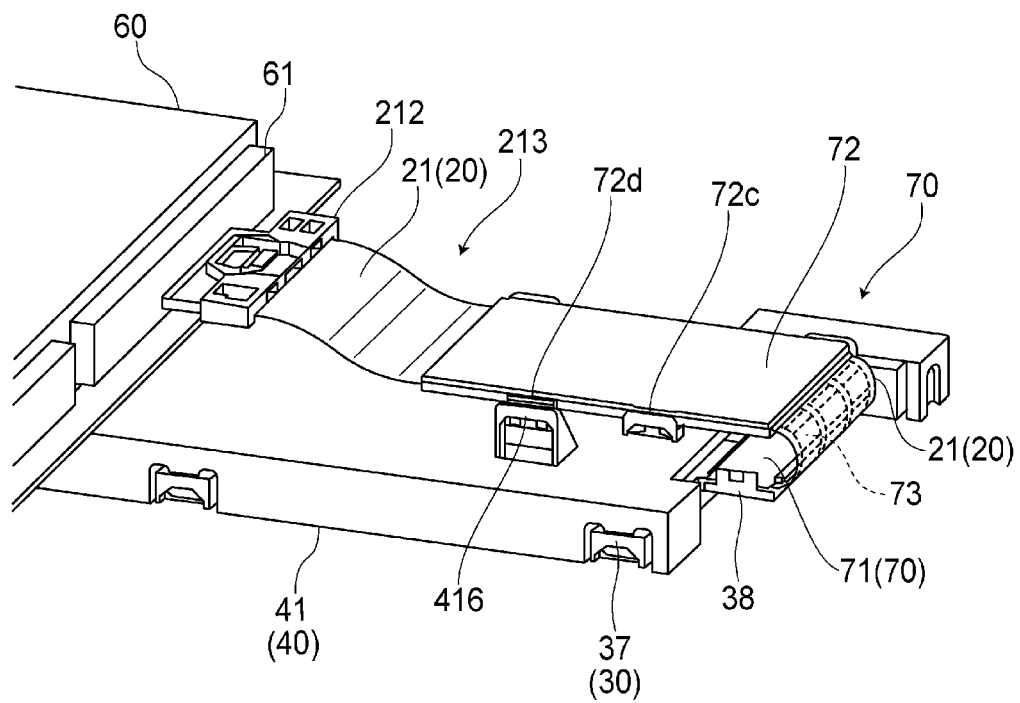
FIG. 22 is a perspective view showing the condition where a protector attached to the circuit body exposed from the cover is fixed to the cover.

As shown in FIG. 22, the connector 212 situated at the leading end of the exposed part 213 is connected to a connector connection portion 61 of the voltage detector 60 disposed on the upper surface of the cover 40 under a condition where the exposed part 213 of the circuit body 20 is folded back from the base portion thereof toward the upper surface of the cover 40. Under this condition, the coupling portion 73 of the protector 70 is curved, and the leading end side accommodation portion 72 is fixed to the upper surface of the cover 40 by engaging engagement portions 72d on both sides thereof in the width direction (see also FIGS. 23A and 23B) with engagement portions 416 of the cover 40 (see also FIGS. 20A and 20B, etc.).

Figure 24A:
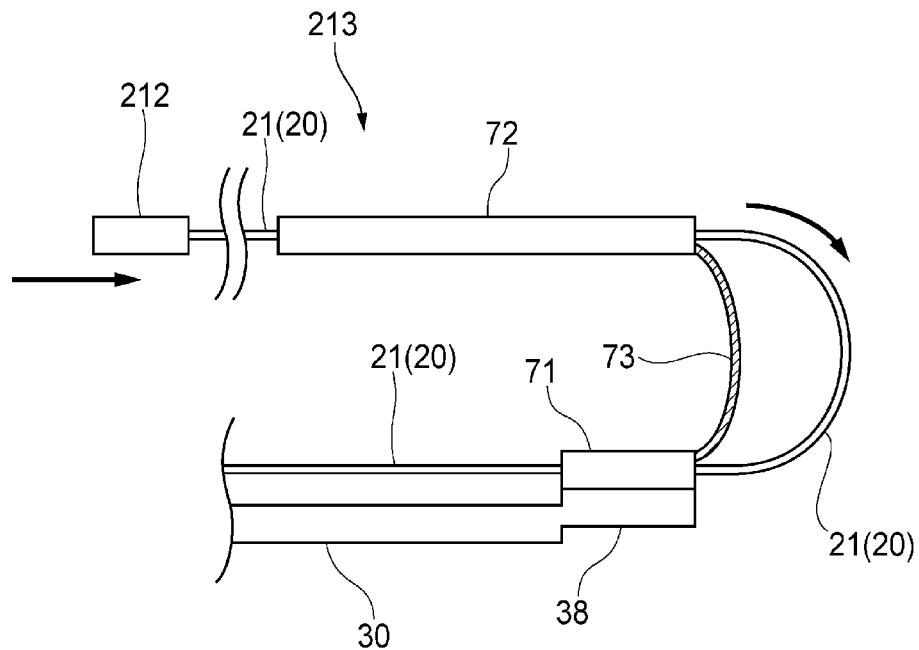
FIG. 24A is a schematic view for explaining a manner in which a connector provided on the front end portion of the circuit body moves forward under the condition where the protector is fixed to the cover.
Figure 24B:
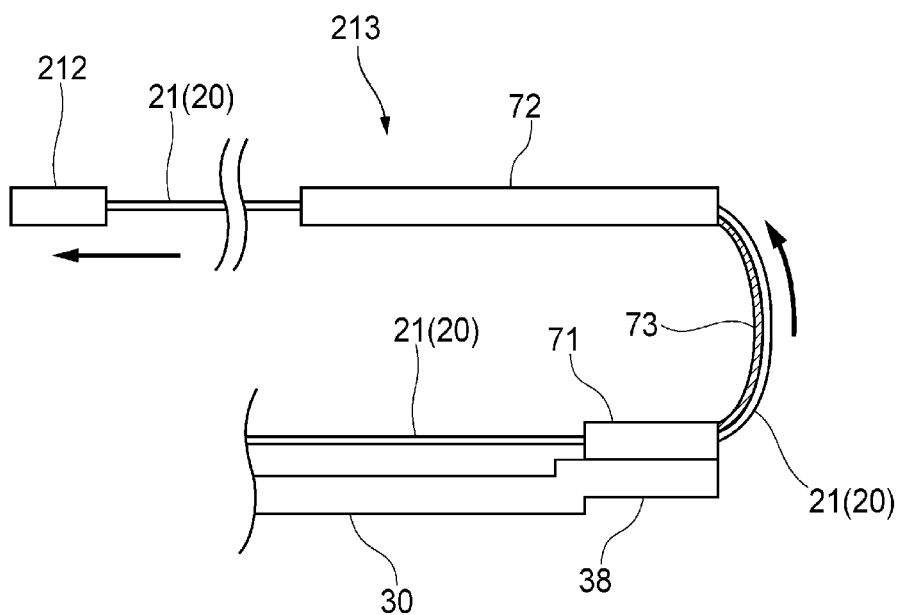
FIG. 24B is a schematic view for explaining a manner in which the connector provided on the front end portion of the circuit body moves rearward under the condition where the protector is fixed to the cover.

As shown in FIGS. 24A and 24B, by sliding the circuit body 20 with respect to the leading end side accommodation portion 72, the circuit body 20 can be deformed in a direction away from the coupling portion 73 also under a condition where the coupling portion 73 is curved and the leading end side accommodation portion 72 is fixed to the upper surface of the cover 40. That is, the deformation of the circuit body 20 is not prevented. For this reason, not only the connector 212 is movable in the front-rear direction relatively to the cover 40 but also handling of the circuit body 20 can be made easy.

Main Effects of the Present Embodiment

According to the bus bar module 10 according to the present embodiment, the circuit body 20 formed of a flexible board has the main line 21 that can be disposed on the upper part of the single cells 2, the first branch portions 22 extending outward from the side portions of the main line 21, and the second branch portions 23 connecting with the first branch portions 22 and extending parallel to the assembled direction of the single cells 2. The second branch portion 23 is provided with the folded portion 231 folded around the axis L intersecting in the assembled direction (in the width direction). For this reason, when the single cells 2 repetitively stretch and shrink in the thickness direction (assembled direction) and when the positions of the single cells 2 differ among the manufactured battery assemblies 1 due to the assembly tolerances of the single cells 2, the folded portions 231 of the second branch portions 23 bend and stretch, so that the bus bars 25 are movable in the thickness direction of the single cells 2.

As described above, the bus bar module 10 is capable of easily handling the stretch and shrinkage and the manufacturing variations of the battery assembly 1 substantially by the deformation of only the first and second branch lines 22 and 23 without the need for any deformation of the main line 21 of the circuit body 20. Moreover, even when a multiplicity of circuit structures are contained, the flexible board is typically easy to become deformed flexibly with a far smaller force than normal electric wires used for the above-described conventional bus bar module. For this reason, the assemblability to the battery assembly 1 is significantly improved. Therefore, the bus bar module 10 is excellent in the assemblability to the battery assembly 1 and the conformability to the deformation and the manufacturing variations of the battery assembly 1.

Further, in the bus bar module 10 according to the present embodiment, the folded portions 231 are provided in such a manner that the lower surfaces of the connection portions 24 of the second branch portions 23 are along a surface different from the lower surface of the main line 21. Therefore, contact between the single cells 2 and the main line 21 can be suppressed without the provision of a projecting plate or the like on the upper surfaces of the single cells 2. Therefore, contribution can be made to reduction in height, reduction in the number of parts, simplification of the manufacturing process and the like of the bus bar module 10.

Further, in the bus bar module 10 according to the present embodiment, the second branch portions 23 are formed in an S shape provided with the first folded portion 231A and the second folded portion 231B. For this reason, even if the relative positions of the bus bars 25 change in any direction in the length direction of the main line 21, the change can be followed, and return to the initial position is made possible.

Further, in the bus bar module 10 according to the present embodiment, since the cover 40 also stretches and shrinks in the lamination direction as the holder 30 stretches and shrinks in the lamination direction, the circuit body 20 and the bus bar 25 can be protected from the outside while the assemblability to the battery assembly 1 and the conformability to the manufacturing variations are improved.

Further, in the bus bar module 10 according to the present embodiment, irrespective of in which positions in the stretchable and shrinkable range the front side portion 41 and the rear side portion 42 constituting the cover 40 are situated, the portion of coupling of the front side portion 41 and the rear side portion 42 are closed so that the inside and outside of the cover 40 do not communicate with each other. Consequently, even if the cover 40 stretches and shrinks, the condition where the circuit body 20 and the bus bar 25 are protected from the outside can be maintained.

The present invention is not limited to the above-described embodiments, and various modifications may be adopted within the scope of the present invention. For example, the present invention is not limited to the above-described embodiment, and modifications, improvements and the like are possible as appropriate. Besides, the materials, shapes, dimensions, numbers, disposition positions and the like of the elements of the above-described embodiment are arbitrary as long as the present invention is attained, and are not limited.

Now, features of the above-described embodiment of the bus bar module 10 according to the present invention is briefly summarized and listed in the following [1] to [3]:

[1] There is a provided a bus bar module (10) configured to be attached to a battery assembly (1) having a plurality of single cells (2) which are assembled to each other along a first direction, the bus bar module (10) including:
  a circuit body (20) configured by a flexible board on which a wiring pattern (204a, 204b) is provided;
  a bus bar (25) configured to be connected to an electrode of each of the single cells;
  a holder (30) configured to hold the bus bar (25) and being stretchable and shrinkable in the first direction; and
  a cover (40) configured to be assembled to the holder (30) to protect the circuit body (20) and the holder (30),
  wherein the circuit body (20) includes:
    a belt-like main line (20) that extends in the first direction;
    a belt-like branch line (22, 23) that extends from the main line (20) so as to branch from the main line (20), a part of the branch line (23) extending in the first direction and including a folded portion (231) having a shape folded back around an axis (L1, L2) intersecting with the first direction; and
    a connection portion (24) provided in a position closer to a distal end of the branch line than the folded portion and configured to be connected to the bus bar; and
  wherein the cover (40) is structured so as to be stretchable and shrinkable in the first direction in accordance with a stretching and a shrinking of the holder (30) in the first direction.

[2] In the bus bar module according to the above [1], the cover (40) has a plurality of portions (41, 42) arranged in the first direction and the plurality of portions are coupled to each other so as to be movable relatively to each other.

[3] In the bus bar module according to the above [2], a movable range of each of the plurality of portions is limited, and each of the plurality of portions is structured so as to prevent an inside and outside of the cover from communicating with each other even when each of the plurality of portions is arranged in the movable range.

What is claimed is:

1. A bus bar module configured to be attached to a battery assembly having a plurality of single cells which are assembled to each other along an assemble direction, the bus bar module comprising:
  a bus bar that includes an electrode hole configured to be connected to an electrode of a respective one of the single cells; and
  a holder holding the bus bar, wherein
  the holder includes
    an inner wall that extends in the assemble direction,
    an outer wall that extends in the assemble direction and is spaced away from the inner wall in a width direction that intersects the assemble direction, and
    a bottom wall coupled to the inner wall and the outer wall, the bottom wall extends in the width direction and the assemble direction, the bottom wall opposes the bus bar, each of the inner wall and the outer wall protrudes from the bottom wall,
  the inner wall has a first engagement claw engaging the bus bar, the busbar is located between the bottom wall and the first engagement claw,
  the inner wall, the outer wall, and the bottom wall bound a bus bar space, the bus bar is located in the bus bar space and abuts the bottom wall,
  the inner wall includes a cut part that is an opening that extends through the inner wall in the width direction,
  the inner wall protrudes away from the bottom wall in an extending direction and terminates at an edge that is spaced away from the bottom wall in the extending direction, and
  the inner wall is provided with a first projection that extends along an inner side surface of the inner wall and from the bottom wall to the edge in the extending direction, and the first projection tapers as it extends in the extending direction.

2. The bus bar module according to claim 1, wherein the outer wall has a second engagement claw that faces the first engagement claw of the inner wall.

3. The bus bar module according to claim 2, wherein the first projection is arranged on a center part of the inner side surface of the inner wall in the assemble direction, the first engagement claw and another engagement claw are provided on the inner side surface of the inner wall so that the first projection is arranged between the first engagement claw and the another engagement claw in the assemble direction.

4. The bus bar module according to claim 1, wherein the first projection is fitted in a first positioning concave portion of the bus bar, and the outer wall is provided with a second projection that faces the first projection provided on the inner wall and is fitted in a second positioning concave portion of the bus bar.

5. The bus bar module according to claim 1, wherein
the holder includes a support plate that projects from the inner wall in the width direction and projects away from the busbar space in the width direction, and
the bus bar includes a connection piece that extends in the width direction through the cut part and away from the inner wall, the connection piece extends along the support plate in the width direction.

6. The bus bar module according to claim 1, wherein
the holder includes a pair of partitions that protrude from the bottom wall and are spaced away from each other in the assemble direction, each of the partitions extends from the outer wall to the inner wall in the width direction, and the partitions bound the busbar space.

* * * * *